(12) United States Patent
Yamada

(10) Patent No.: US 12,439,665 B2
(45) Date of Patent: Oct. 7, 2025

(54) SEMICONDUCTOR DEVICE, METHOD FOR MANUFACTURING SEMICONDUCTOR DEVICE, AND ELECTRONIC DEVICE

(71) Applicant: Fujitsu Limited, Kawasaki (JP)

(72) Inventor: Atsushi Yamada, Hiratsuka (JP)

(73) Assignee: Fujitsu Limited, Kawasaki (JP)

( * ) Notice: Subject to any disclaimer, the term of this patent is extended or adjusted under 35 U.S.C. 154(b) by 411 days.

(21) Appl. No.: 18/177,399

(22) Filed: Mar. 2, 2023

(65) Prior Publication Data

US 2024/0006493 A1    Jan. 4, 2024

(30) Foreign Application Priority Data

Jun. 30, 2022   (JP) ................................ 2022-106120

(51) Int. Cl.
  *H10D 62/85*     (2025.01)
  *H10D 30/01*     (2025.01)
  *H10D 30/47*     (2025.01)
  *H10D 64/27*     (2025.01)

(52) U.S. Cl.
  CPC ....... *H10D 62/8503* (2025.01); *H10D 30/015* (2025.01); *H10D 30/475* (2025.01); *H10D 64/514* (2025.01)

(58) Field of Classification Search
  CPC .. H10D 64/685; H10D 64/693; H10D 64/514; H10D 62/824; H10D 62/8503
  See application file for complete search history.

(56) References Cited

U.S. PATENT DOCUMENTS

| | | | |
|---|---|---|---|
| 2009/0159930 A1 | 6/2009 | Smorchkova et al. | |
| 2012/0273779 A1* | 11/2012 | Yamazaki | H10D 30/031 257/43 |
| 2014/0124792 A1* | 5/2014 | Hagleitner | H10D 64/64 257/77 |
| 2014/0264367 A1 | 9/2014 | Banerjee et al. | |
| 2016/0020313 A1* | 1/2016 | Wu | H10D 62/824 257/194 |
| 2018/0019333 A1* | 1/2018 | Kamada | H10D 30/4755 |
| 2019/0296137 A1* | 9/2019 | Yamada | H10D 62/405 |
| 2021/0288169 A1* | 9/2021 | Yamada | H01L 21/02389 |
| 2021/0384340 A1* | 12/2021 | Ozaki | H10D 30/015 |

FOREIGN PATENT DOCUMENTS

| | | |
|---|---|---|
| JP | 2014-003301 A | 1/2014 |
| JP | 2016-167600 A | 9/2016 |
| WO | WO 2007/018918 A2 | 2/2007 |
| WO | WO 2011/031431 A2 | 3/2011 |

\* cited by examiner

*Primary Examiner* — Alexander G Ghyka
(74) *Attorney, Agent, or Firm* — ArentFox Schiff LLP

(57) ABSTRACT

A semiconductor device includes: a channel layer that includes a first nitride semiconductor that contains Ga; a barrier layer that is provided on a first surface side of the channel layer, and includes a second nitride semiconductor that contains In, Al, and Ga; a source electrode and a drain electrode that are provided on a second surface side of the barrier layer opposite to the channel layer side; a gate electrode that is provided between the source electrode and the drain electrode, on the second surface side of the barrier layer; and an insulating layer that is provided between the second surface of the barrier layer and the gate electrode.

9 Claims, 13 Drawing Sheets

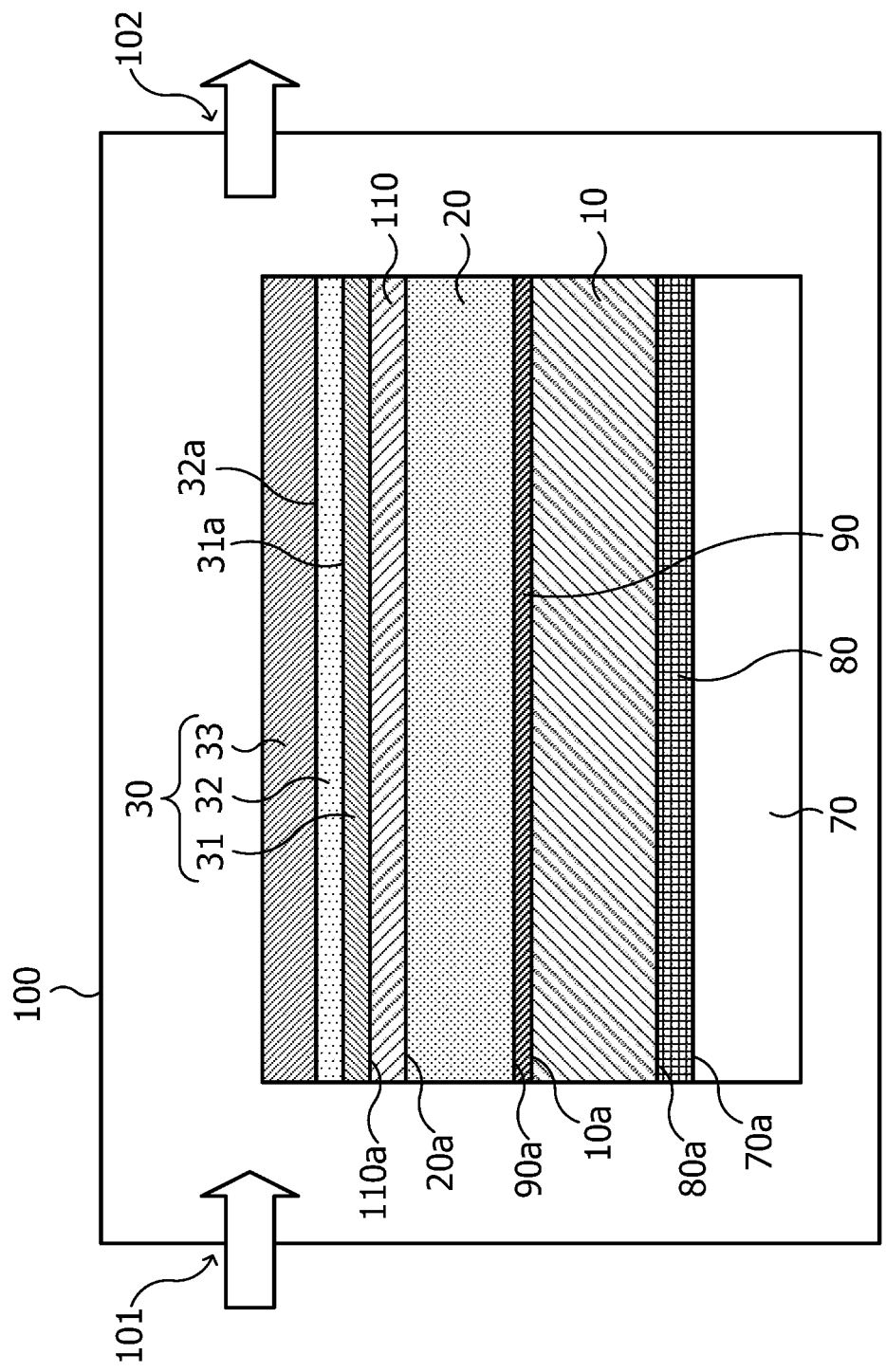

SEMICONDUCTOR DEVICE, METHOD FOR MANUFACTURING SEMICONDUCTOR DEVICE, AND ELECTRONIC DEVICE

CROSS-REFERENCE TO RELATED APPLICATION

This application is based upon and claims the benefit of priority of the prior Japanese Patent Application No. 2022-106120, filed on Jun. 30, 2022, the entire contents of which are incorporated herein by reference.

FIELD

The embodiments discussed herein are related to a semiconductor device, a method for manufacturing the semiconductor device, and an electronic device.

BACKGROUND

A semiconductor device including a nitride semiconductor is known. For example, a high electron mobility transistor (HEMT) including a channel layer (also referred to as a carrier transit layer, an electron transit layer, or the like) using gallium nitride (GaN) or the like and a barrier layer (also referred to as a carrier supply layer, an electron supply layer, or the like) using aluminum gallium nitride (AlGaN) or the like is known.

Japanese Laid-open Patent Publication No. 2014-3301, Japanese Laid-open Patent Publication No. 2016-167600, and U.S. Patent No. 2014/0264367 are disclosed as related art.

SUMMARY

According to an aspect of the embodiments, a semiconductor device includes: a channel layer that includes a first nitride semiconductor that contains Ga; a barrier layer that is provided on a first surface side of the channel layer, and includes a second nitride semiconductor that contains In, Al, and Ga; a source electrode and a drain electrode that are provided on a second surface side of the barrier layer opposite to the channel layer side; a gate electrode that is provided between the source electrode and the drain electrode, on the second surface side of the barrier layer; and an insulating layer that is provided between the second surface of the barrier layer and the gate electrode, wherein the insulating layer includes a first insulating film that is provided on the second surface side of the barrier layer and contains SiN, a second insulating film that is provided on a third surface side of the first insulating film opposite to the barrier layer side and contains SiAlN, and a third insulating film that is provided on a fourth surface side of the second insulating film opposite to the first insulating film side, has an opening portion that leads to the fourth surface, and contains SiN, and the gate electrode is provided at the opening portion of the third insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram (part 1) describing the example of the method for manufacturing the semiconductor device according to the third embodiment;

DESCRIPTION OF EMBODIMENTS

Regarding such an HEMT, a technology is known in which an etch stop layer and a dielectric layer over the etch stop layer are provided over a barrier layer over a channel layer or over a cap layer over the barrier layer, and a gate contact is provided in a gate recess that extends through the dielectric layer and the etch stop layer. With this technology, it is proposed to use silicon nitride (SiN) or the like for the dielectric layer, to use aluminum nitride (AlN) or the like for the etch stop layer, and to use GaN or the like or SiN or the like formed over GaN for the cap layer.

A technology is known in which a gate insulating layer is provided over a barrier layer over a channel layer, an etching stop layer is provided over the gate insulating layer, an electrode defining layer is provided over the etching stop layer, and an electrode is provided in a recess portion provided in the electrode defining layer. With this technology, it is proposed to use SiN or the like for the gate insulating layer, to use AlN or the like for the etching stop layer, and to use SiN or the like for the electrode defining layer.

A technology is known in which a silicon nitride film is provided over a barrier film over a channel film, an AlN film is provided over the silicon nitride film, a cap layer or the like including silicon nitride is provided over the AlN film, and a gate electrode is provided at a gate electrode opening provided at the cap layer or the like.

Meanwhile, as a semiconductor device using a nitride semiconductor, a semiconductor device including an HEMT in which GaN is used for a channel layer and indium aluminum gallium nitride (InAlGaN) is used for a barrier layer is known. InAlGaN is a material that may realize a relatively high aluminum (Al) composition, and may obtain large spontaneous polarization by increasing the Al composition. By using InAlGaN for the barrier layer, it is expected that a two dimensional electron gas (2DEG) having a higher concentration may be generated in the channel layer and an output of the HEMT may be increased, as compared with a case where AlGaN is used.

Meanwhile, in a case where the nitride semiconductor containing In, in addition to Al and Ga, is used for the barrier layer, the following may occur. For example, in a case where the barrier layer is exposed to etching in a manufacturing process of the semiconductor device, damage such as generation of a defect caused by breakage of a relatively weak bond between In and N or desorption of In may be inflicted on the barrier layer. The damage inflicted on the barrier layer may cause deterioration in performance of the semiconductor device including the HEMT, such as an increase in leakage current.

According to one aspect, an object of the present disclosure is to realize a high-performance semiconductor device including a barrier layer in which damage is suppressed.

First Embodiment

Figure 1:
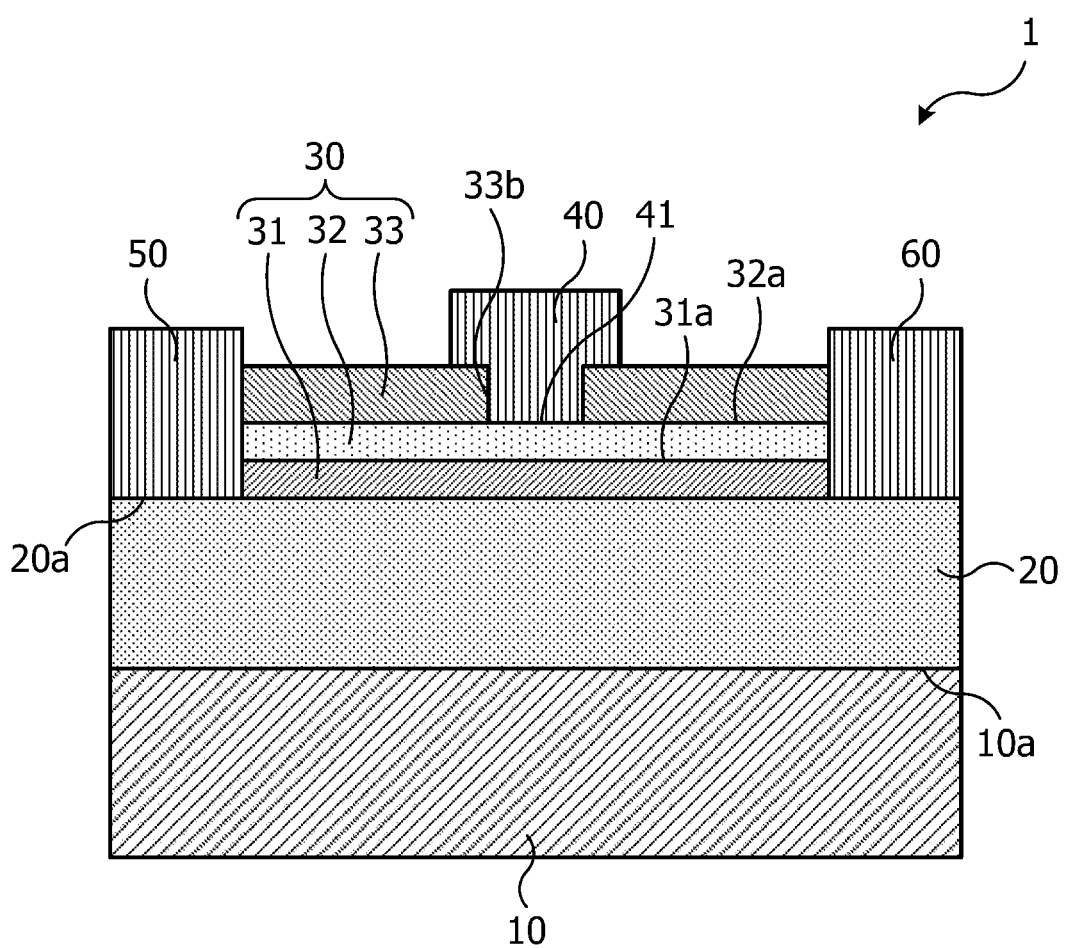
FIG. 1 a diagram describing an example of a semiconductor device according to a first embodiment.

FIG. 1 is a diagram describing an example of a semiconductor device according to a first embodiment. FIG. 1 schematically illustrates a main portion cross-sectional diagram of the example of the semiconductor device.

A semiconductor device 1 illustrated in FIG. 1 is an example of a semiconductor device including an HEMT. The semiconductor device 1 includes a channel layer 10, a barrier layer 20, an insulating layer 30, a gate electrode 40, a source electrode 50, and a drain electrode 60.

The channel layer 10 includes a nitride semiconductor (also referred to as a "first nitride semiconductor") containing Ga. For example, GaN is used for the channel layer 10. Although not illustrated herein, the channel layer 10 is provided over a predetermined substrate. As the substrate, a silicon carbide (SiC) substrate, a GaN substrate, a silicon (Si) substrate, a sapphire substrate, or the like, or a substrate in which a nucleation layer is provided over such a substrate may be used.

The barrier layer 20 is provided on one surface 10a (also referred to as a "first surface") side of the channel layer 10. The surface 10a of the channel layer 10 is, for example, a (0001) surface (c-surface, group III-polar surface). The barrier layer 20 includes a nitride semiconductor having a bandgap larger than a bandgap of the nitride semiconductor included in the channel layer 10. The barrier layer 20 includes the nitride semiconductor containing In, Al, and Ga (also referred to as a "second nitride semiconductor"). For example, InAlGaN having a bandgap larger than a bandgap of GaN is used for the barrier layer 20.

For example, the channel layer 10 and the barrier layer 20 are grown, by using a metal organic chemical vapor deposition (MOCVD) or metal organic vapor phase epitaxy (MOVPE) method or a molecular beam epitaxy (MBE) method. The channel layer 10 and the barrier layer 20 are continuously formed in a film formation device such as an MOVPE device without being exposed to an atmosphere. Therefore, since the channel layer 10 and the barrier layer 20 are not exposed to the atmosphere, occurrence of a defect such as an interface state between the channel layer 10 and the barrier layer 20 may be suppressed.

In the semiconductor device 1, a 2DEG is generated, in the vicinity of a joining interface of the channel layer 10 with the barrier layer 20, by spontaneous polarization of the barrier layer 20 and piezoelectric polarization generated by distortion caused by a difference in lattice constants with the channel layer 10.

Generally, the nitride semiconductor containing In, Al, and Ga, for example, InAlGaN is known as a material capable of realizing a relatively high Al composition. When using InAlGaN having a relatively high Al composition for the barrier layer 20, large spontaneous polarization is obtained, and it is possible to generate the 2DEG having a higher concentration in the channel layer 10, as compared with a case where AlGaN is used for the barrier layer 20.

The insulating layer 30 includes a first insulating film 31, a second insulating film 32, and a third insulating film 33.

The first insulating film 31 is provided on a surface 20a (also referred to as a "second surface") side of the barrier layer 20 opposite to the channel layer 10 side. The surface 20a of the barrier layer 20 is, for example, a (0001) surface (c-surface, group III-polar surface). The first insulating film 31 includes silicon nitride (STN).

The second insulating film 32 is provided on a surface 31a (also referred to as a "third surface") side of the first insulating film 31 opposite to the barrier layer 20 side. The second insulating film 32 is a film stacked over the surface 31a of the first insulating film 31. The second insulating film 32 includes silicon aluminum nitride (SiAlN).

The third insulating film 33 is provided on a surface 32a (also referred to as a "fourth surface") side of the second insulating film 32 opposite to the first insulating film 31 side. The third insulating film 33 is a film stacked over the surface 32a of the second insulating film 32. The third insulating film 33 has an opening portion 33b leading to the surface 32a of the second insulating film 32. The third insulating film 33 includes SiN.

In the insulating layer 30, the first insulating film 31 and the third insulating film 33 serve as passivation films that protect the barrier layer 20 (and the channel layer 10 below the barrier layer 20). A material different from a material of the third insulating film 33 (and the first insulating film 31) is used for the second insulating film 32, and the second insulating film 32 serves as an etching stopper when the opening portion 33b is formed at the third insulating film 33 by etching.

The insulating layer 30 is formed by a method in the same manner as the method for forming the channel layer 10 and the barrier layer 20, for example, an MOVPE method. At this time, preferably, the first insulating film 31, the second insulating film 32, and the third insulating film 33 are continuously formed without being exposed to the atmosphere in the film formation device such as the MOVPE device. For example, in the film formation device, first, the first insulating film 31 is formed at the surface 20a of the barrier layer 20. Subsequently to the formation of the first insulating film 31, the second insulating film 32 is formed at the surface 31a of the first insulating film 31, in the same film formation device. Subsequently to the formation of the second insulating film 32, the third insulating film 33 is formed at the surface 32a of the second insulating film 32, in the same film formation device. When the first insulating film 31, the second insulating film 32, and the third insulating film 33 are respectively formed by different film formation devices, surfaces after the formation may be oxidized by being exposed to the atmosphere, which may cause a characteristic deterioration. When the first insulating film 31, the second insulating film 32, and the third insulating film 33 are continuously formed in the same film formation device without being exposed to the atmosphere, such a characteristic deterioration may be suppressed.

The formation of the insulating layer 30 is preferably performed continuously with the formation of the channel layer 10 and the barrier layer 20 without being exposed to the atmosphere, in the film formation device used for the formation of the channel layer 10 and the barrier layer 20. When the channel layer 10 and the barrier layer 20 are taken out of the film formation device before the formation of the insulating layer 30, a surface of the barrier layer 20 is exposed to the atmosphere and a defect such as a surface state is generated, which may cause a characteristic deterioration. When the insulating layer 30 is continuously formed in the same film formation device as the formation of the channel layer 10 and the barrier layer 20 without being exposed to the atmosphere, such a characteristic deterioration may be suppressed.

The gate electrode 40, the source electrode 50, and the drain electrode 60 are provided on the surface 20a ((0001) surface) side of the barrier layer 20 opposite to the channel layer 10 side. A predetermined metal is used for each of the gate electrode 40, the source electrode 50, and the drain electrode 60.

The gate electrode 40 is provided between the source electrode 50 and the drain electrode 60. The gate electrode 40 is provided at a position of the opening portion 33b of the third insulating film 33 in the insulating layer 30. A bottom surface 41 of the gate electrode 40 on the barrier layer 20 side is in contact with the surface 32a of the second insulating film 32 in the insulating layer 30. The gate electrode 40 is provided on the surface 20a side of the barrier layer 20 via the insulating layer 30. The gate electrode 40 is provided in a metal insulator semiconductor (MIS) type gate structure.

The source electrode 50 and the drain electrode 60 are respectively located on both sides of the gate electrode 40 so as to be spaced apart from the gate electrode 40. The source electrode 50 and the drain electrode 60 penetrate through the insulating layer 30. For example, the source electrode 50 and the drain electrode 60 are in contact with the surface 20a of the barrier layer 20. The source electrode 50 and the drain electrode 60 function as ohmic electrodes. A regrowth layer using a nitride semiconductor of GaN, AlGaN, or the like containing an n-type impurity may be provided as a contact layer in portions of the barrier layer 20 to which the source electrode 50 and the drain electrode 60 are coupled.

At a time of an operation of the semiconductor device 1, a predetermined voltage is supplied between the source electrode 50 and the drain electrode 60, and a predetermined gate voltage is supplied to the gate electrode located between the source electrode 50 and the drain electrode 60. A transport path for an electron serving as a carrier is formed at the channel layer between the source electrode 50 and the drain electrode 60, and a transistor function of the semiconductor device 1 is realized.

In the semiconductor device 1, the insulating layer 30 having a three-layer stack structure of the first insulating film 31, the second insulating film 32, and the third insulating film 33 is provided between the barrier layer 20 and the gate electrode 40. The gate electrode 40 is provided at the opening portion 33b of the third insulating film 33 in the insulating layer 30. At a time of the formation of the gate electrode 40, the opening portion 33b is formed at the third insulating film 33 in the insulating layer 30 by etching, and the gate electrode 40 is formed at the opening portion 33b. At a time of etching of the third insulating film 33, the second insulating film 32 which is located under the third insulating film 33 and is formed of a material different from a material of the third insulating film 33 functions as an etching stopper for the etching. Accordingly, it is possible to suppress the etching from reaching the barrier layer through the insulating layer 30. Since the etching is suppressed from reaching the barrier layer 20, damage inflicted on the barrier layer 20 due to exposure to the etching is suppressed.

A case where an insulating layer made of a single material is provided between the barrier layer over the channel layer and the gate electrode is considered. In this case, when an opening portion that penetrates through the insulating layer and reaches the barrier layer is formed at the insulating layer by etching, the barrier layer exposed through the formed opening portion may be exposed to the etching, so damage may be inflicted on the barrier layer. For example, in a case where a nitride semiconductor of InAlGaN or the like containing In, Al, and Ga is used as the barrier layer, when the barrier layer is exposed to the etching, damage is likely to be inflicted on the barrier layer, such as generation of a defect caused by breakage of a relatively weak bond between In and N, desorption of In, or the like. The damage to the barrier layer may cause deterioration in performance of the semiconductor device, such as an increase in leakage current. In order to suppress the damage to the barrier layer due to such etching, it is also considered that a part of the insulating layer is left over a surface of the barrier layer without penetrating through the opening portion formed at the insulating layer by etching. Meanwhile, in this case, it is difficult to control a film thickness of the part of the insulating layer left over the surface of the barrier layer, for example, a stop position of the etching. When the stop position of the etching of the insulating layer is not controlled, a distance between the channel layer and the gate electrode provided in the opening portion formed by the etching is not controlled, and thus the performance of the semiconductor device including the HEMT may not be stabilized.

By contrast, in the semiconductor device 1 described above, the insulating layer 30 having a three-layer structure is provided between the barrier layer 20 over the channel layer 10 and the gate electrode 40. The insulating layer 30 includes the first insulating film 31, the third insulating film 33, and the second insulating film 32 provided between the first insulating film 31 and the third insulating film 33 and made of a material different from a material of the first insulating film 31 and the third insulating film 33. SiN is used for the first insulating film 31 and the third insulating film 33, and SiAlN is used for the second insulating film 32.

By etching, the opening portion 33b is formed at the third insulating film 33 in the insulating layer 30 by using the second insulating film 32 as an etching stopper, and the gate electrode 40 is formed at the opening portion 33b formed at the third insulating film 33. Film thicknesses of the first insulating film 31 and the second insulating film 32 remaining between the barrier layer 20 and the gate electrode 40 are preferably set based on an appropriate distance between the gate electrode 40 and the channel layer 10. A film thickness of the third insulating film 33 is preferably set to a film thickness capable of sufficiently protecting the barrier layer 20 and the channel layer 10.

A material having an etching resistance to an etching gas used for etching the third insulating film 33 and a material having an etching selectivity to the etching gas are used for the second insulating film 32 in the insulating layer 30. A fluorine-based gas is used for the etching of the third insulating film 33 using SiN. As an example, boiling points and melting points of silicon tetrafluoride ($SiF_4$) and aluminum trifluoride ($AlF_3$), which are fluorides generated when an insulating film containing each element of Si and Al is placed in an etching environment using the fluorine-based gas, are as follows. $SiF_4$ has a boiling point of $-95.5°$ C. and a melting point of $-86°$ C. $AlF_3$ has a boiling point of $1272°$ C. and a melting point of 1090° C. From these findings, it may be said that Al fluoride has a higher boiling point and a higher melting point than Si fluoride, and that it is difficult to obtain a reaction product having high volatility with the fluorine-based gas. For this reason, the second insulating film 32 containing Al has a high etching resistance to the fluorine-based gas used for etching the third insulating film 33. The second insulating film 32 using SiAlN containing Al is suitable as an etching stopper when the third insulating film 33 using SiN is etched by using the fluorine-based gas. When SiAlN is used for the second insulating film 32, adhesion of the first insulating film 31 and the third insulating film 33 using SiN is improved, as compared with the case where AlN is used for the second insulating film 32.

As described above, in the semiconductor device 1, the insulating layer 30 having a three-layer structure including the first insulating film 31 and the third insulating film 33 using SiN, and the second insulating film 32 using SiAlN provided between the first insulating film 31 and the third insulating film 33 is provided between the barrier layer 20 over the channel layer 10 and the gate electrode 40. Therefore, when the opening portion 33b is formed at the third insulating film 33, exposure of the barrier layer 20 and damage inflicted on the barrier layer 20 caused by the exposure are suppressed, and deterioration in performance of the semiconductor device 1 such as an increase in leakage current due to the damage is suppressed. With the second insulating film 32 serving as an etching stopper when the opening portion 33b is formed and the first insulating film 31 under the second insulating film 32, the distance between the gate electrode 40 formed at the opening portion 33b and the channel layer is controlled, and the performance of the semiconductor device 1 is stabilized. By adopting the insulating layer 30 having the three-layer structure as described above, the high-performance semiconductor device 1 including the barrier layer in which damage is suppressed is stably realized.

Second Embodiment

Figure 2:
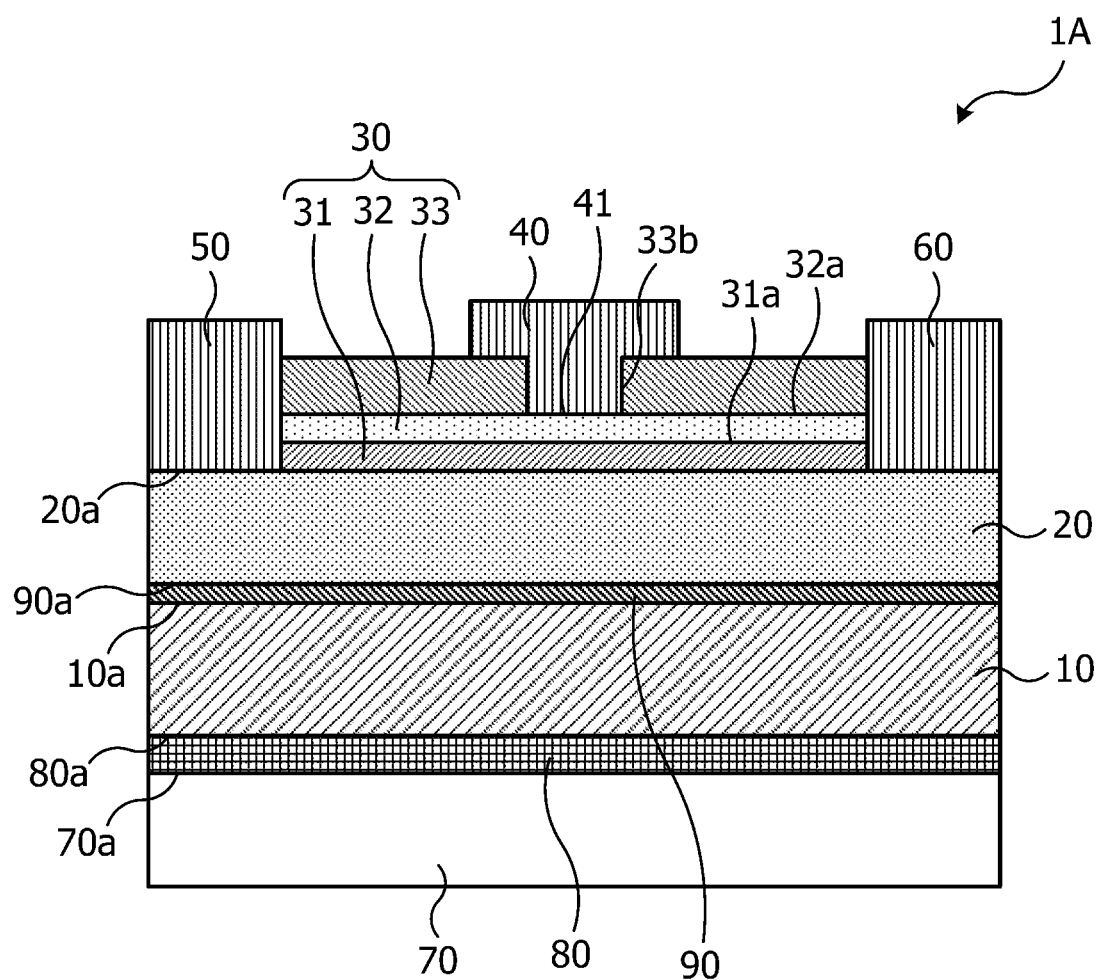
FIG. 2 is a diagram describing an example of a semiconductor device according to a second embodiment.

FIG. 2 is a diagram describing an example of a semiconductor device according to a second embodiment. FIG. 2 schematically illustrates a main portion cross-sectional diagram of the example of the semiconductor device.

A semiconductor device 1A illustrated in FIG. 2 is an example of a semiconductor device including an HEMT. The semiconductor device 1A includes a base substrate 70, a nucleation layer 80, the channel layer 10, a spacer layer the barrier layer 20, the insulating layer 30, the gate electrode 40, the source electrode 50, and the drain electrode 60.

As the channel layer 10, the barrier layer 20, the insulating layer the gate electrode 40, the source electrode 50, and the drain electrode 60 in the semiconductor device 1A, devices in the same manner as the semiconductor device 1 (FIG. 1) described in the first embodiment described above are used.

For example, a semi-insulating SiC substrate is used as the base substrate 70 of the semiconductor device 1A. Alternatively, a conductive SiC substrate, a GaN substrate, a Si substrate, a sapphire substrate, or the like may be used for the base substrate 70. The nucleation layer 80 is provided on one surface 70a of the base substrate 70. For example, AlN is used for the nucleation layer 80.

The channel layer 10 as described in the first embodiment described above, for example, the channel layer 10 of GaN is provided on a surface 80a side of the nucleation layer 80 opposite to the base substrate 70 side. The surface 80a of the nucleation layer 80 is, for example, a (0001) surface (c-surface, group III-polar surface).

The spacer layer 90 is provided on the surface 10a ((0001) surface) side of the channel layer 10 opposite to the nucleation layer 80 side. The spacer layer 90 includes a nitride semiconductor having a bandgap larger than a bandgap of a nitride semiconductor included in the channel layer 10. The spacer layer 90 includes the nitride semiconductor containing Al (also referred to as a "third nitride semiconductor"). For example, AlGaN, AlN, or the like having a bandgap larger than a bandgap of GaN of the channel layer 10 is used for the spacer layer 90.

The barrier layer 20 as described in the first embodiment described above, for example, the barrier layer 20 of InAlGaN is provided on a surface 90a side of the spacer layer 90 opposite to the channel layer 10 side. The surface 90a of the spacer layer 90 is, for example, a (0001) surface (c-surface, group III-polar surface).

The insulating layer 30 is provided on the surface 20a ((0001) surface) side of the barrier layer 20 opposite to the channel layer 10 (or the spacer layer 90) side. The insulating layer 30 includes the first insulating film 31, the second insulating film 32, and the third insulating film 33.

The first insulating film 31 is provided at the surface 20a of the barrier layer 20. SiN is used for the first insulating film 31. The second insulating film 32 is provided at the surface 31a of the first insulating film 31 on an opposite side to the barrier layer 20. SiAlN is used for the second insulating film 32. The third insulating film 33 is provided at the surface 32a of the second insulating film 32 on an opposite side to the first insulating film 31. The opening portion 33b leading to the surface 32a of the second insulating film 32 is provided at the third insulating film 33. SiN is used for the third insulating film 33. The second insulating film 32 functions as an etching stopper when the opening portion 33b is formed at the third insulating film 33 by etching.

The gate electrode 40, the source electrode 50, and the drain electrode 60 as described in the first embodiment described above are provided on the surface 20a ((0001) surface) side of the barrier layer 20 opposite to the channel layer 10 (or the spacer layer 90) side.

The gate electrode 40 is provided at the opening portion 33b of the third insulating film 33 in the insulating layer 30. The bottom surface 41 of the gate electrode 40 on the barrier layer 20 side is in contact with the surface 32a of the second insulating film 32. The gate electrode 40 is provided on the surface 20a side of the barrier layer 20 via the insulating layer 30. The gate electrode 40 is provided in an MIS type gate structure. The source electrode 50 and the drain electrode 60 penetrate through the insulating layer 30. The source electrode 50 and the drain electrode 60 function as ohmic electrodes. A regrowth layer using GaN or the like containing an n-type impurity may be provided as a contact layer immediately below the source electrode 50 and the drain electrode 60.

By using InAlGaN having a predetermined Al composition for the barrier layer 20 over the channel layer 10 in the semiconductor device 1A, large spontaneous polarization may be obtained as compared with AlGaN, and concentration of the 2DEG generated in the channel layer 10 may be increased, and accordingly, a high output of the semiconductor device 1A may be realized.

In the semiconductor device 1A, the insulating layer 30 having a three-layer structure including the first insulating film 31 using SiN, the second insulating film 32 using SiAlN, and the third insulating film 33 using SiN is provided between the barrier layer 20 and the gate electrode 40. The second insulating film 32 functions as an etching stopper when the opening portion 33b is formed at the third insulating film 33 by etching. Therefore, exposure of the barrier layer 20 during the etching and damage inflicted on the barrier layer 20 caused by the exposure may be suppressed. For example, it is possible to suppress damage inflicted on the barrier layer 20 such as generation of a defect due to breakage of a relatively weak bond between In and N in the barrier layer of InAlGaN or desorption of In. By suppressing the damage inflicted on the barrier layer 20, deterioration in performance of the semiconductor device 1A such as an increase in leakage current may be suppressed. With the second insulating film 32 and the first insulating film 31 remaining after the etching, a distance between the gate electrode 40 formed at the opening portion 33b and the channel layer 10 is controlled, and the performance of the semiconductor device 1A is stabilized. By adopting the insulating layer 30 having the three-layer structure as described above, the high-performance semiconductor device 1A including the barrier layer 20 in which damage is suppressed is stably realized.

Next, a method for manufacturing the semiconductor device 1A having the configuration described above will be described with reference to FIGS. 3 to 5B and FIG. 2 described above.

FIGS. 3 to 5B are diagrams describing an example of a method for manufacturing the semiconductor device according to the second embodiment. Each of FIGS. 3, 4A, 4B, 5A, and 5B schematically illustrates a main portion cross-sectional diagram of each step in manufacturing the semiconductor device.

Figure 3:
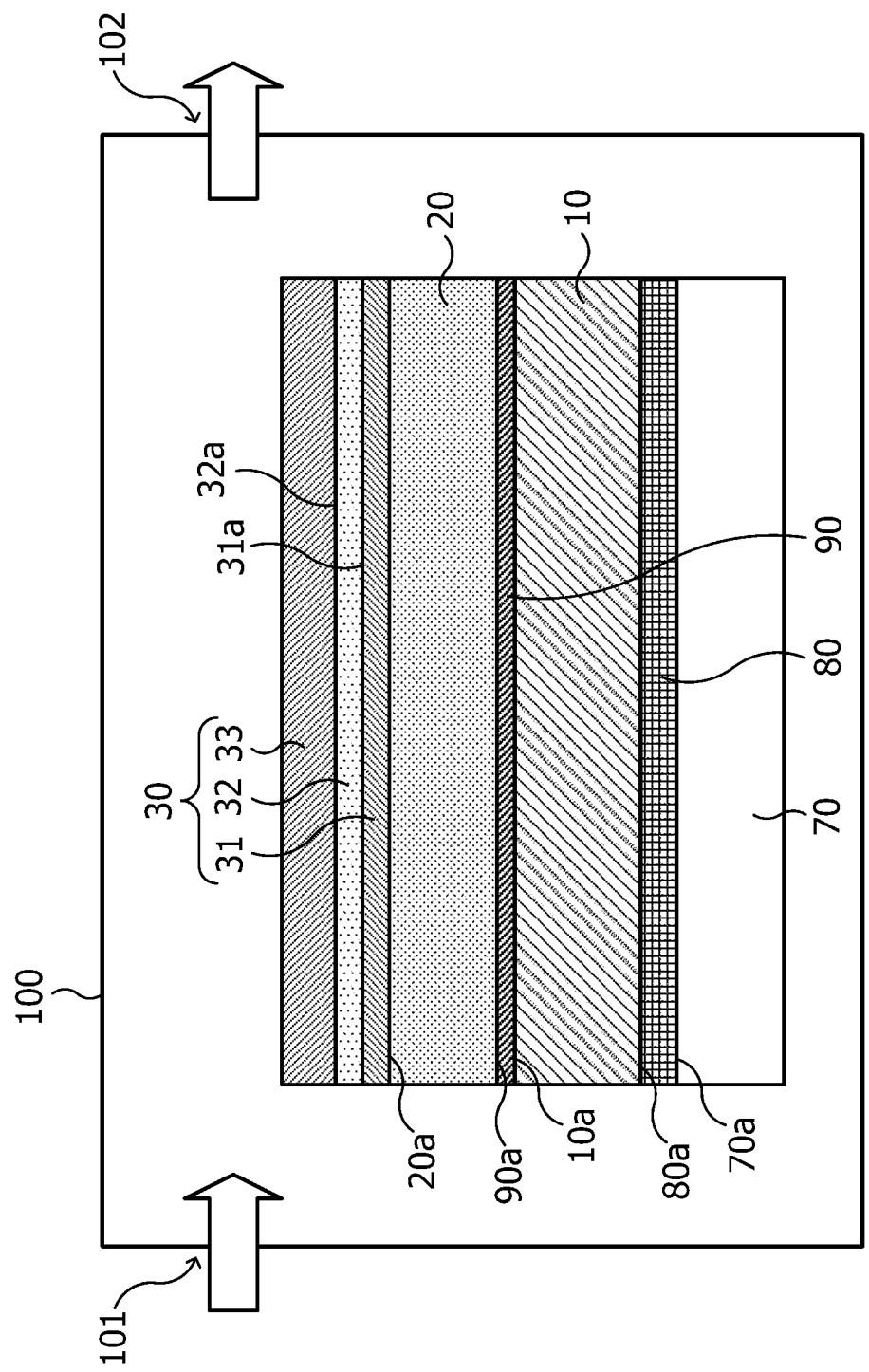
FIG. 3 is a diagram (part 1) describing the example of the method for manufacturing the semiconductor device according to the second embodiment.

First, by using a film formation device 100 as illustrated in FIG. 3, the nucleation layer 80, the channel layer 10, the spacer layer 90, and the barrier layer 20 are sequentially grown over the base substrate 70, and the insulating layer 30 is further formed over the barrier layer 20. The film formation device 100 is an MOVPE device that performs film formation by the MOVPE method.

For example, the nucleation layer 80 of AlN is grown over the surface 70a of the base substrate 70 of semi-insulating SiC, by using the MOVPE method. A thickness of the nucleation layer 80 is set to, for example, 100 nm. The channel layer 10 of GaN is grown over the surface 80a of the nucleation layer 80, by using the MOVPE method. A thickness of the channel layer 10 is set to, for example, 3 µm. The spacer layer 90 of AlGaN or AlN (composition formula $Al_xGa_{1-x}N$) is grown over the surface 10a of the channel layer 10, by using the MOVPE method. A thickness of the spacer layer 90 is set to, for example, 2 nm. An Al composition x of the spacer layer 90 of $Al_xGa_{1-x}$ is set to, for example, $0.40 \le x \le 1.00$. The barrier layer 20 of InAlGaN (composition formula $In_yAl_zGa_{1-y-z}N$) is grown over the surface 90a of the spacer layer 90, by using the MOVPE method. A thickness of the barrier layer 20 is set to, for example, 6 nm. An Al composition z of the barrier layer 20 of $In_yAl_zGa_{1-y-z}N$ is set to, for example, $0.10 \le z \le 1.00$. An In composition y of the barrier layer 20 of $In_yAl_zGa_{1-y-z}N$ is set to, for example, $0.00 < y \le 0.20$. Meanwhile, $0.00 < y+z < 1.00$ is set.

The insulating layer 30 including the first insulating film 31, the second insulating film 32, and the third insulating film 33 is formed at the surface of the barrier layer 20. First, the first insulating film 31 of SiN is formed at the surface 20a of the barrier layer 20 by the MOVPE method. A film thickness of the first insulating film 31 is set to 4 nm, for example. The second insulating film 32 of SiAlN is formed at the surface 31a of the first insulating film 31 by the MOVPE method. A film thickness of the second insulating film 32 is set to 2 nm, for example. The third insulating film 33 of SiN is formed at the surface 32a of the second insulating film 32 by the MOVPE method. A film thickness of the third insulating film 33 is set to 40 nm, for example.

A mixed gas of tri-methyl-gallium (TMGa), which is a Ga source, and ammonia ($NH_3$) is used for growth of GaN, in the growth of each of the nitride semiconductor layers (the nucleation layer 80, the channel layer 10, the spacer layer 90, and the barrier layer 20) by using the film formation device 100. A mixed gas of TMGa, $NH_3$, and tri-methyl-aluminum (TMAl), which is an Al source, is used for growth of AlGaN. A mixed gas of TMAl and $NH_3$ is used for growth of AlN. A mixed gas of TMAl, TMGa, $NH_3$, and tri-methyl-indium (TMIn), which is an In source, is used for growth of InAlGaN. Supply and stop (switching) of TMGa, TMAl, and TMIn and flow rates thereof (mixing ratios with other raw materials) during the supply are set as appropriate, depending on the nitride semiconductor to be grown. As a carrier gas, hydrogen ($H_2$) or nitrogen ($N_2$) is used. A pressure condition during the growth is set to be in a range from approximately 1 kPa to approximately 100 kPa. A temperature condition during the growth is set to be in a range from approximately 700° C. to approximately 1200° C.

In the formation of the insulating layer 30 using the film formation device 100, a mixed gas of silane ($SiH_4$), which is a Si source, and $NH_3$ is used for formation of SiN. A mixed gas of $SiH_4$ which is a Si source, TMAl which is an Al source, and $NH_3$ is used for formation of SiAlN.

A predetermined raw material is supplied from a supply port 101 of the film formation device 100, and growth and formation of a predetermined layer are performed in the film formation device 100. A gas in the film formation device 100 is discharged from an outlet 102.

Preferably, the nucleation layer 80, the channel layer 10, the spacer layer 90, and the barrier layer 20 are continuously formed in the same film formation device 100. Therefore, since the nucleation layer 80, the channel layer 10, the spacer layer 90, and the barrier layer 20 are not exposed to the atmosphere after each growth, occurrence of a defect such as an interface state between the respective layers is suppressed.

Preferably, the first insulating film 31, the second insulating film 32, and the third insulating film 33 of the insulating layer 30 are continuously formed in the same film formation device 100. Therefore, since the first insulating film 31, the second insulating film 32, and the third insulating film 33 are not exposed to the atmosphere after each formation, oxidation is suppressed, and a characteristic deterioration due to the oxidation is suppressed.

Preferably, the first insulating film 31, the second insulating film 32, and the third insulating film 33 of the insulating layer 30 are continuously formed in the same film formation device 100 after the growth of the nucleation layer 80, the channel layer 10, the spacer layer 90, and the barrier layer 20 in the film formation device 100. Therefore, since the barrier layer 20 after the growth is not exposed to the atmosphere, occurrence of a defect such as a surface state of the barrier layer 20 is suppressed.

Preferably, the nucleation layer 80, the channel layer 10, the spacer layer 90, the barrier layer 20, the first insulating film 31, the second insulating film 32, and the third insulating film 33 are continuously and sequentially formed in the same film formation device 100.

With the film formation using the film formation device 100 as described above, a stack structure as illustrated in FIG. 4A is formed. For example, the stack structure is formed in which the nucleation layer 80, the channel layer 10, the spacer layer 90, and the barrier layer 20 are sequentially grown over the base substrate 70, and the first insulating film 31, the second insulating film 32, and the third insulating film 33 of the insulating layer 30 are sequentially formed over the barrier layer 20.

Although an example in which the spacer layer 90 is provided is described here, the barrier layer 20 may be grown on the channel layer 10, without providing the spacer layer 90.

After the formation of the stack structure, an inter-element isolation region (not illustrated) is formed. For example, first, a mask (not illustrated) having an opening portion in a region in which an inter-element isolation region is to be formed is formed by using a photolithography technology. Dry etching using a chlorine-based gas or implantation of ion such as argon (Ar) is performed on a stack structure in the opening portion of the mask to form the inter-element isolation region. After the formation of the inter-element isolation region, the mask is removed.

Figure 4A:
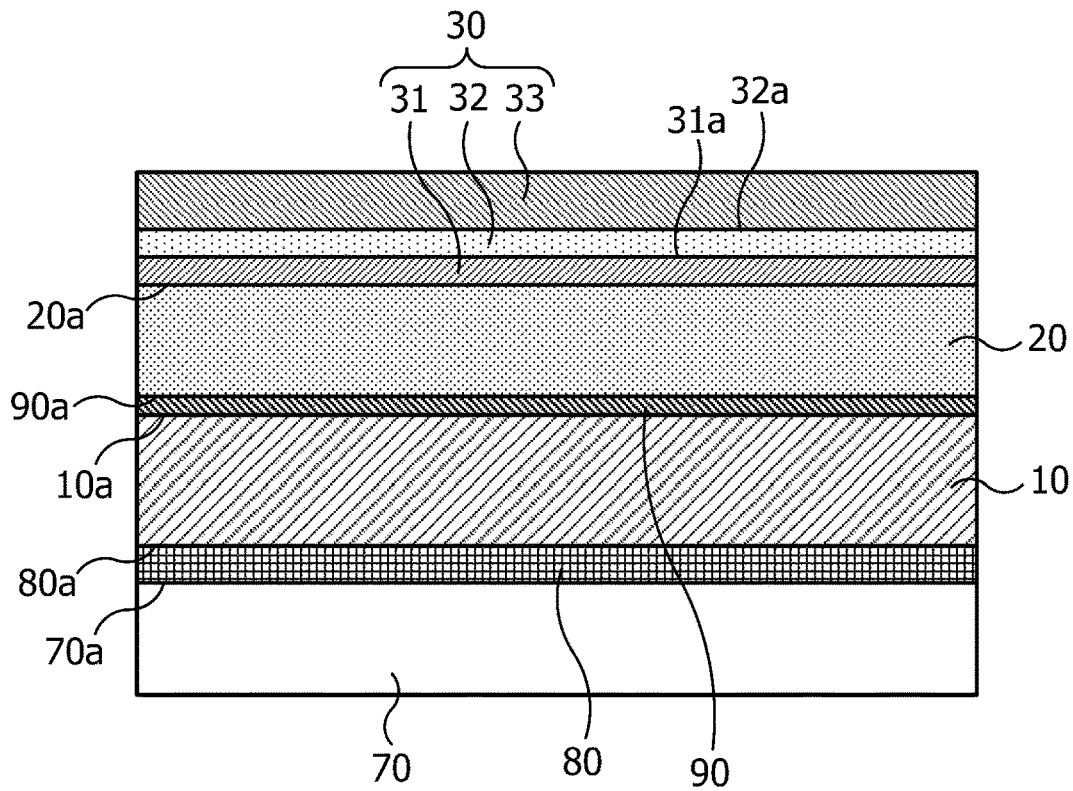
FIGS. 4A and 4B are diagrams (part 2) describing the example of the method for manufacturing the semiconductor device according to the second embodiment.
Figure 4B:
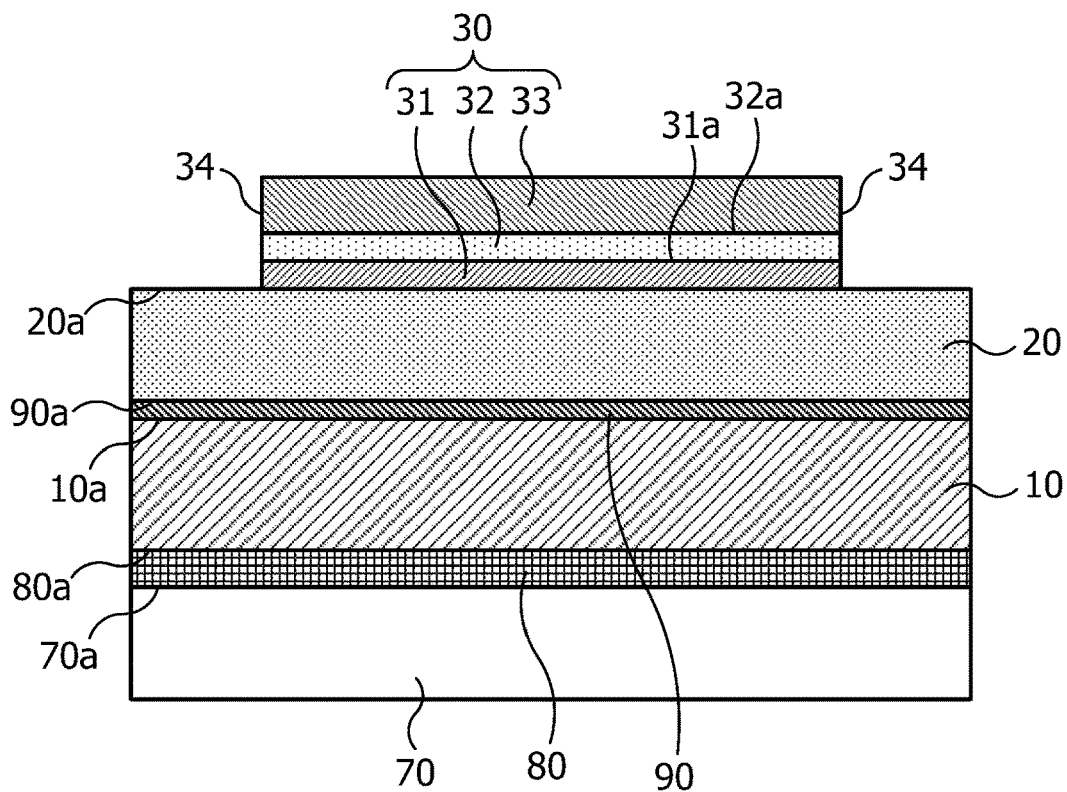

After the formation of the stack structure and the inter-element isolation region as described above, as illustrated in FIG. 4B, the insulating layer in regions in which the source electrode 50 and the drain electrode 60 are to be formed is removed by etching to form opening portions 34 leading to the barrier layer 20. For example, first, a mask (not illustrated) having an opening portion in the regions in which the source electrode 50 and the drain electrode are to be formed is formed by using the photolithography technology. Dry etching using a fluorine-based gas or a chlorine-based gas is performed on the insulating layer 30 at the opening portion of the mask to remove the third insulating film 33, the second insulating film 32, and the first insulating film 31. Therefore, the insulating layer 30 having the opening portions 34 is formed, as illustrated in FIG. 4B. After the formation of the opening portion 34, the mask is removed.

Figure 5A:
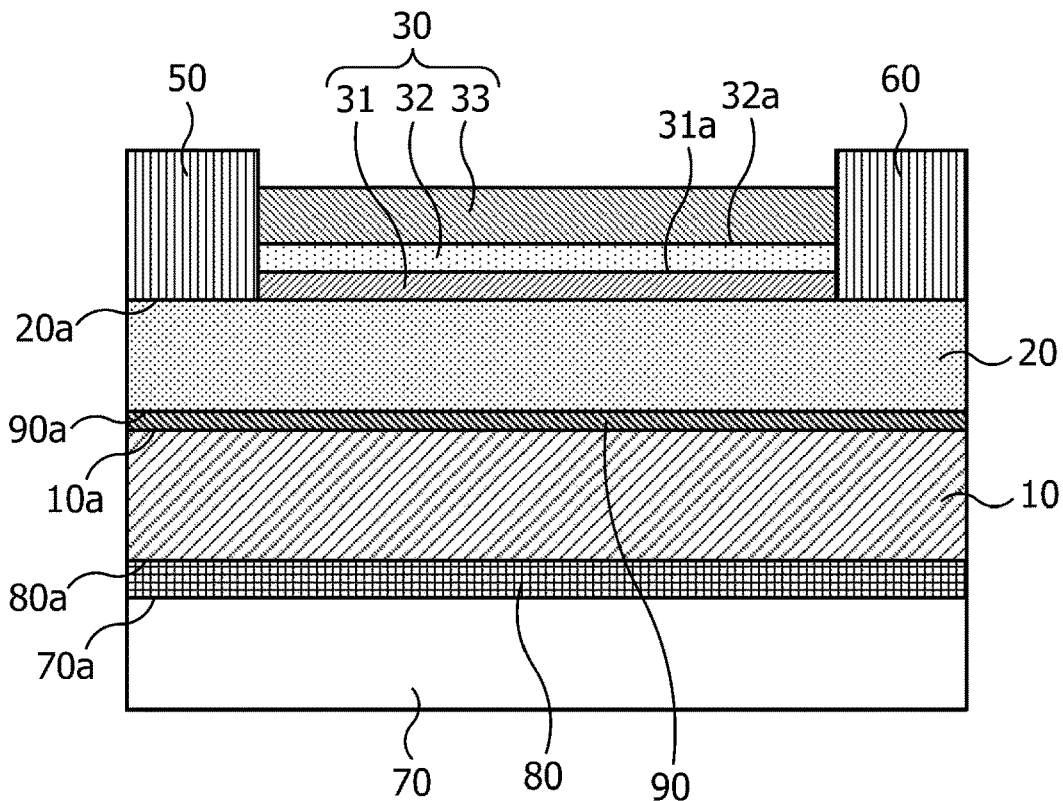
FIGS. 5A and 5B are diagrams (part 3) describing the example of the method for manufacturing the semiconductor device according to the second embodiment.

After the formation of the opening portion 34 of the insulating layer as illustrated in FIG. 5A, the source electrode 50 and the drain electrode 60 are formed at the opening portions 34 of the insulating layer 30. In this case, first, an electrode metal is formed in the regions where the source electrode 50 and the drain electrode 60 are to be formed, by using a photolithography technology, a vapor deposition technology, and a lift-off technology. For example, a stack of Ta having a thickness of 20 nm and Al having a thickness of 200 nm is formed as the electrode metal. After the formation of the electrode metal, heat treatment is performed under a temperature condition in a range of 400° C. to 1000° C., for example, at a temperature of 550° C. in a nitrogen atmosphere to build an ohmic contact of the electrode metal. Therefore, the source electrode 50 and the drain electrode 60 are formed over the barrier layer at the opening portions 34 of the insulating layer 30.

Figure 5B:
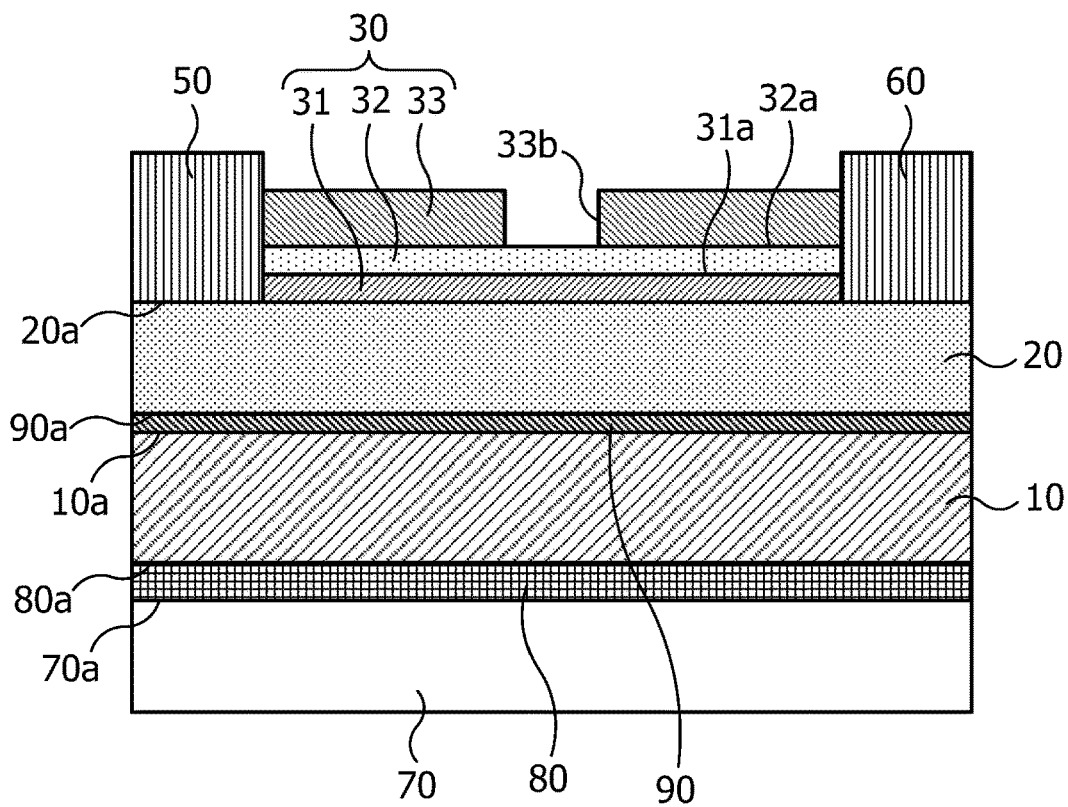

After the formation of the source electrode 50 and the drain electrode 60, as illustrated in FIG. 5B, the opening portion 33b is formed at the third insulating film 33 of the insulating layer 30. The opening portion 33b is provided in a region in which the gate electrode 40 is to be formed. At a time of the formation of the opening portion 33b, first, a mask (not illustrated) having an opening portion in a region where the gate electrode 40 is to be formed is formed by using the photolithography technology, and dry etching using a fluorine-based gas is performed. By this etching, the third insulating film 33 of SiN exposed from the opening portion of the mask is removed, and the opening portion 33b of the third insulating film 33 is formed. SiAlN used for the second insulating film 32 has higher an etching resistance to the fluorine-based gas than SiN used for the third insulating film 33. Accordingly, in the etching of the third insulating film 33 of SiN using the fluorine-based gas, the second insulating film 32 of SiAlN below the third insulating film 33 functions as an etching stopper. For this reason, the opening portion 33b is formed by etching with high depth-accuracy. After the formation of the opening portion 33b by etching the third insulating film 33, the mask is removed.

After the formation of the opening portion 33b of the third insulating film 33 in the insulating layer 30, as illustrated in FIG. 2 described above, the gate electrode 40 is formed at the position of the opening portion 33b. At this time, an electrode metal is formed at the position of the opening portion 33b of the third insulating film 33 by using the photolithography technology, the vapor deposition technology, and the lift-off technology. For example, a stack of nickel (Ni) having a thickness of 30 nm and gold (Au) having a thickness of 400 nm is formed as the electrode metal. The electrode metal is formed so as to enter the opening portion 33b, in addition to an upper surface of the third insulating film 33. Therefore, the gate electrode 40 having a MIS type gate structure is formed.

By the steps in this manner, the semiconductor device 1A as illustrated in FIG. 2 described above is manufactured.

In the semiconductor device 1A, the insulating layer 30 having a three-layer structure including the first insulating film 31 using SiN, the second insulating film 32 using SiAlN, and the third insulating film 33 using SiN is provided between the barrier layer 20 and the gate electrode 40. The second insulating film 32 functions as an etching stopper when the opening portion 33b is formed at the third insulating film 33 by etching. Therefore, exposure of the barrier layer 20 during the etching and damage inflicted on the barrier layer 20 caused by the exposure may be suppressed. By suppressing the damage inflicted on the barrier layer 20, deterioration in performance of the semiconductor device 1A such as an increase in leakage current may be suppressed. For example, it is possible to suppress damage inflicted on the barrier layer 20 such as generation of a defect due to breakage of a relatively weak bond between In and N in the barrier layer 20 of InAlGaN or desorption of In. With the second insulating film 32 and the first insulating film 31 remaining after the etching, a distance between the gate electrode 40 formed at the opening portion 33b and the channel layer 10 is controlled, and the performance of the semiconductor device 1A is stabilized. By adopting the insulating layer 30 having the three-layer structure as described above, the high-performance semiconductor device 1A including the barrier layer 20 in which damage is suppressed is stably realized.

In the semiconductor device 1A, the types of metals and the layer structures of the gate electrode 40, the source electrode 50, and the drain electrode 60 are not limited to the examples described above, and the methods for forming the gate electrode 40, the source electrode 50, and the drain electrode 60 are not limited to the examples described above. Each of the gate electrode 40, the source electrode 50, and the drain electrode 60 may have a single-layer structure or a stack structure. At the time of the formation of the source electrode 50 and the drain electrode 60, the heat treatment as described above does not have to be performed as long as the ohmic contact is realized by the formation of the electrode metals for these electrodes. At the time of the formation of the gate electrode 40, heat treatment may be further performed after the formation of the electrode metal for the gate electrode 40.

Third Embodiment

Figure 6:
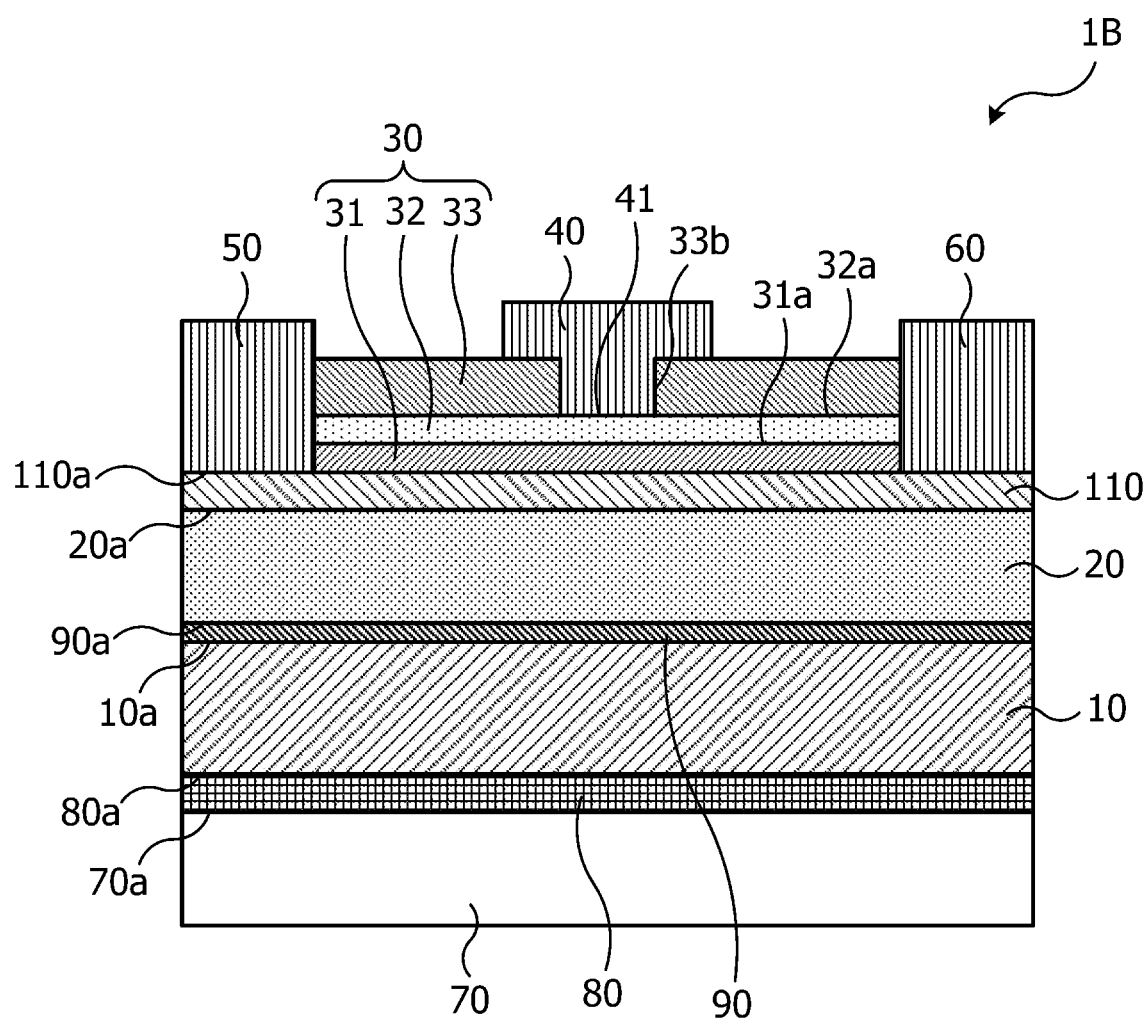
FIG. 6 is a diagram describing an example of a semiconductor device according to a third embodiment.

FIG. 6 is a diagram describing an example of a semiconductor device according to a third embodiment. FIG. 6 schematically illustrates a main portion cross-sectional diagram of the example of the semiconductor device.

A semiconductor device 1B illustrated in FIG. 6 is an example of a semiconductor device including an HEMT. The semiconductor device 1B has a configuration in which a cap layer 110 is provided on the surface 20a side of the barrier layer 20 opposite to the channel layer 10 (or the spacer layer 90) side. The cap layer 110 is provided between the barrier layer 20 and the insulating layer 30. The insulating layer 30 is provided between the cap layer 110 and the gate electrode 40. The semiconductor device 1B is different from the semiconductor device 1A described in the second embodiment described above in that the semiconductor device 1B has such a configuration.

As the channel layer 10, the barrier layer 20, the insulating layer 30, the gate electrode 40, the source electrode 50, and the drain electrode 60 in the semiconductor device 1B, devices in the same manner as the semiconductor device 1 (FIG. 1) described in the first embodiment described above and the semiconductor device 1A (FIG. 3 or the like) described in the second embodiment described above are used. In the semiconductor device 1B, the base substrate 70, the nucleation layer 80, and the spacer layer 90 in the same manner as those of the semiconductor device 1A (FIG. 3 and the like) described in the second embodiment described above are used.

The cap layer 110 is provided on the surface 20a ((0001) surface) side of the barrier layer 20. The insulating layer 30 and the gate electrode 40 located at the opening portion 33b of the third insulating film 33 of the insulating layer 30 are provided on a surface 110a (also referred to as a "fifth surface") side of the cap layer 110 opposite to the barrier layer 20 side. The surface 110a of the cap layer 110 is, for example, a (0001) surface (c-surface, group III-polar surface). The insulating layer 30 is provided between the surface 110a of the cap layer 110 and the gate electrode 40. The gate electrode 40 is provided at the surface 20a side of the barrier layer 20 via the cap layer 110 and the insulating layer 30. The cap layer 110 includes a nitride semiconductor containing Ga (also referred to as a "fourth nitride semiconductor"). For example, AlGaN, GaN, or the like is used for the cap layer 110.

In the semiconductor device 1B, the barrier layer 20 is protected, with such a cap layer 110. For example, in a case where a nitride semiconductor of InAlGaN or the like containing In is used for the barrier layer 20, the following may occur. For example, when the barrier layer 20 is exposed to heat in a step involving heating, a relatively weak bond between In and N is broken to cause a defect, or In is desorbed from the barrier layer 20. Damage such as generation of such a defect or the desorption of In is likely to be inflicted on the barrier layer 20 containing In. When such damage is inflicted on the barrier layer 20, an increase in leakage current or the like may be caused.

By contrast, when the cap layer 110 is provided at the surface 20a of the barrier layer 20 as in the semiconductor device 1B, damage such as generation of a defect or desorption of In may be suppressed from being inflicted on the barrier layer 20. Therefore, the high-performance semiconductor device 1B in which an increase in leakage current or the like is suppressed is realized.

Next, a method for manufacturing the semiconductor device 1B having the configuration described above will be described with reference to FIGS. 7 to 9B and FIG. 6 described above.

FIG. 7 to FIG. 9B are diagrams describing an example of a method for manufacturing the semiconductor device according to the third embodiment. Each of FIGS. 7, 8A, 8B, 9A, and 9B schematically illustrates a main portion cross-sectional diagram of each step in manufacturing the semiconductor device.

First, by using the film formation device 100 as illustrated in FIG. 7, the nucleation layer 80, the channel layer 10, the spacer layer 90, the barrier layer 20, and the cap layer 110 are sequentially grown over the base substrate 70, and the insulating layer 30 is further formed over the cap layer 110. The film formation device 100 is the MOVPE device that performs film formation by the MOVPE method.

For example, the nucleation layer 80 of AlN is grown over the surface 70a of the base substrate 70 of semi-insulating SiC, by using the MOVPE method. The thickness of the nucleation layer 80 is set to, for example, 100 nm. The channel layer 10 of GaN is grown over the surface 80a of the nucleation layer 80, by using the MOVPE method. The thickness of the channel layer 10 is set to, for example, 3 μm. The spacer layer 90 of AlGaN or AlN (composition formula $Al_xGa_{1-x}N$) is grown over the surface 10a of the channel layer 10, by using the MOVPE method. The thickness of the spacer layer 90 is set to, for example, 2 nm. The Al composition x of the spacer layer 90 of $Al_xGa_{1-x}N$ is set to, for example, $0.40 \leq x \leq 1.00$. The barrier layer 20 of InAlGaN (composition formula $In_yAl_zGa_{1-y-z}N$) is grown over the surface 90a of the spacer layer 90, by using the MOVPE method. The thickness of the barrier layer 20 is set to, for example, 6 nm. The Al composition z of the barrier layer 20 of $In_yAl_zGa_{1-y-z}N$ is set to, for example, $0.10 \leq z < 1.00$. The In composition y of the barrier layer 20 of $In_yAl_zGa_{1-y-z}N$ is set to, for example, $0.00 < y \leq 0.20$. Meanwhile, $0.00 < y+z < 1.00$ is set.

The cap layer 110 of AlGaN or GaN (composition formula $Al_tGa_{1-t}N$) is grown over the surface 20a of the barrier layer 20 by using the MOVPE method. A thickness of the cap layer 110 is set to, for example, 4 nm. An Al composition t of the cap layer 110 of $Al_tGa_{1-t}N$ is set to, for example, $0.00 \leq t < 1.00$. When Al is contained in the cap layer 110, diffusion of In contained in the barrier layer 20 into the cap layer 110 is suppressed, as compared with a case where Al is not contained.

The insulating layer 30 including the first insulating film 31, the second insulating film 32, and the third insulating film 33 is formed on the surface 110a side of the cap layer 110 opposite to the barrier layer 20 side. The surface 110a of the cap layer 110 is, for example, a (0001) surface (c-surface, group III-polar surface). In the formation of the insulating layer 30, first, the first insulating film 31 of SiN is formed over the surface 110a of the cap layer 110 by using the MOVPE method. The film thickness of the first insulating film 31 is set to 4 nm, for example. The second insulating film 32 of SiAlN is formed at the surface 31a of the first insulating film 31 by the MOVPE method. The film thickness of the second insulating film 32 is set to 2 nm, for example. The third insulating film 33 of SiN is formed at the surface 32a of the second insulating film 32 by the MOVPE method. The film thickness of the third insulating film 33 is set to 40 nm, for example.

In the growth of each of the nitride semiconductor layers (the nucleation layer 80, the channel layer 10, the spacer layer 90, the barrier layer and the cap layer 110) using the film formation device 100, a mixed gas of TMGa, which is a Ga source, and NH$_3$ is used for growth of GaN. A mixed gas of TMAl, which is an Al source, TMGa, and NH$_3$ is used for growth of AlGaN. A mixed gas of TMAl and NH$_3$ is used for growth of AlN. A mixed gas of TMIn, which is an In source, TMAl, TMGa, and NH$_3$ is used for growth of InAlGaN. Supply and stop (switching) of TMGa, TMAl, and TMIn and flow rates thereof (mixing ratios with other raw materials) during the supply are set as appropriate, depending on the nitride semiconductor to be grown. As the carrier gas, H$_2$ or N$_2$ is used. A pressure condition during the growth is set to be in a range from approximately 1 kPa to approximately 100 kPa. A temperature condition during the growth is set to be in a range from approximately 700° C. to approximately 1200° C.

In the formation of the insulating layer 30 using the film formation device 100, a mixed gas of SiH$_4$, which is a Si source, and NH$_3$ is used for formation of SiN. A mixed gas of SiH$_4$ which is a Si source, TMAl which is an Al source, and NH$_3$ is used for formation of SiAlN.

A predetermined raw material is supplied from the supply port 101 of the film formation device 100, and growth and formation of a predetermined layer are performed in the film formation device 100. A gas in the film formation device 100 is discharged from the outlet 102.

Preferably, the nucleation layer 80, the channel layer 10, the spacer layer 90, the barrier layer 20, and the cap layer 110 are continuously formed in the same film formation device 100. Therefore, since the nucleation layer 80, the channel layer 10, the spacer layer 90, the barrier layer 20, and the cap layer 110 are not exposed to the atmosphere after each growth, occurrence of a defect such as an interface state between the respective layers is suppressed.

Preferably, the first insulating film 31, the second insulating film 32, and the third insulating film 33 of the insulating layer 30 are continuously formed in the same film formation device 100. Therefore, since the first insulating film 31, the second insulating film 32, and the third insulating film 33 are not exposed to the atmosphere after each formation, oxidation is suppressed, and a characteristic deterioration due to the oxidation is suppressed.

Preferably, the first insulating film 31, the second insulating film 32, and the third insulating film 33 of the insulating layer 30 are continuously formed in the same film formation device 100 after the growth of the nucleation layer 80, the channel layer 10, the spacer layer 90, the barrier layer 20, and the cap layer 110 in the film formation device 100. Therefore, since the barrier layer 20 after the growth is not exposed to the atmosphere, occurrence of a defect such as a surface state of the barrier layer 20 is suppressed.

Preferably, the nucleation layer 80, the channel layer 10, the spacer layer 90, the barrier layer 20, the cap layer 110, the first insulating film 31, the second insulating film 32, and the third insulating film 33 are continuously and sequentially formed in the same film formation device 100.

With the film formation using the film formation device 100 as described above, a stack structure as illustrated in FIG. 8A is formed. For example, the stack structure is formed in which the nucleation layer 80, the channel layer 10, the spacer layer 90, the barrier layer 20, and the cap layer 110 are sequentially grown over the base substrate 70, and the first insulating film 31, the second insulating film 32, and the third insulating film 33 of the insulating layer 30 are sequentially formed over the cap layer 110.

Although an example in which the spacer layer 90 is provided is described here, the barrier layer 20 may be grown on the channel layer 10, without providing the spacer layer 90.

After the formation of the stack structure, an inter-element isolation region (not illustrated) is formed. For example, first, a mask (not illustrated) having an opening portion in a region in which an inter-element isolation region is to be formed is formed by using the photolithography technology. Dry etching using a chlorine-based gas or implantation of ion such as Ar is performed on a stack structure in the opening portion of the mask to form the inter-element isolation region. After the formation of the inter-element isolation region, the mask is removed.

Figure 8A:
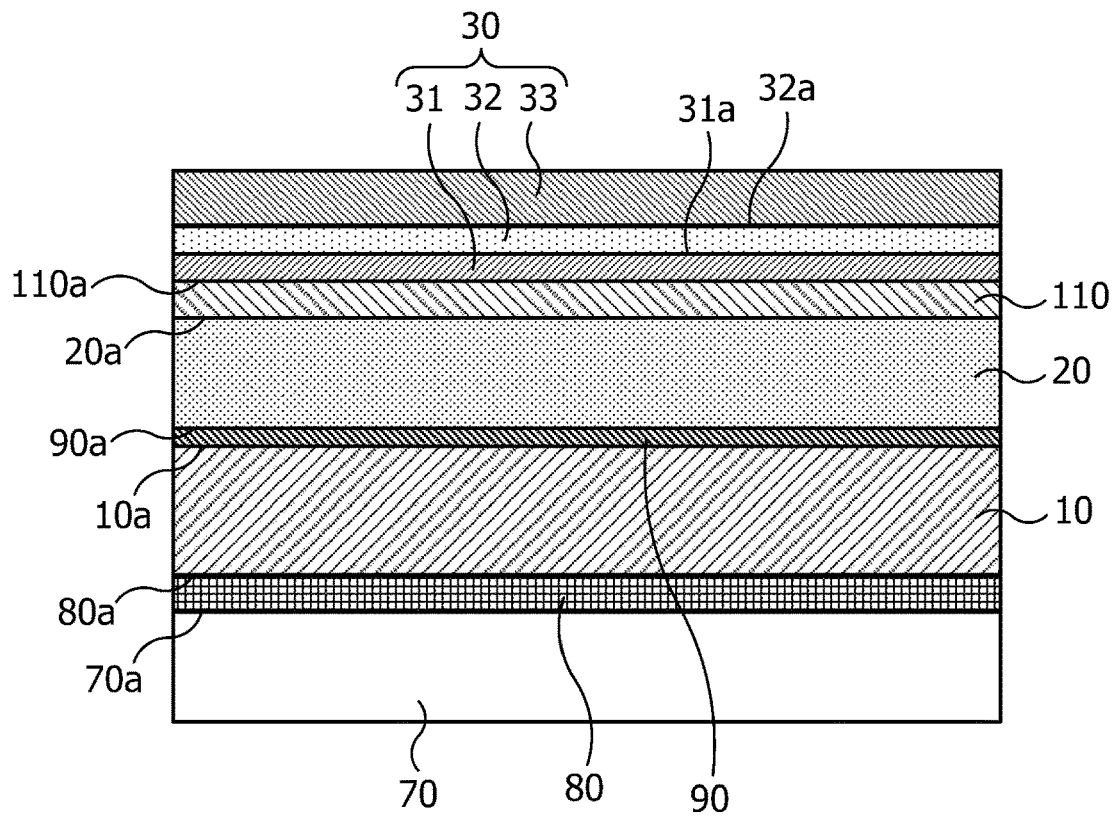
FIGS. 8A and 8B are diagrams (part 2) describing the example of the method for manufacturing the semiconductor device according to the third embodiment.
Figure 8B:
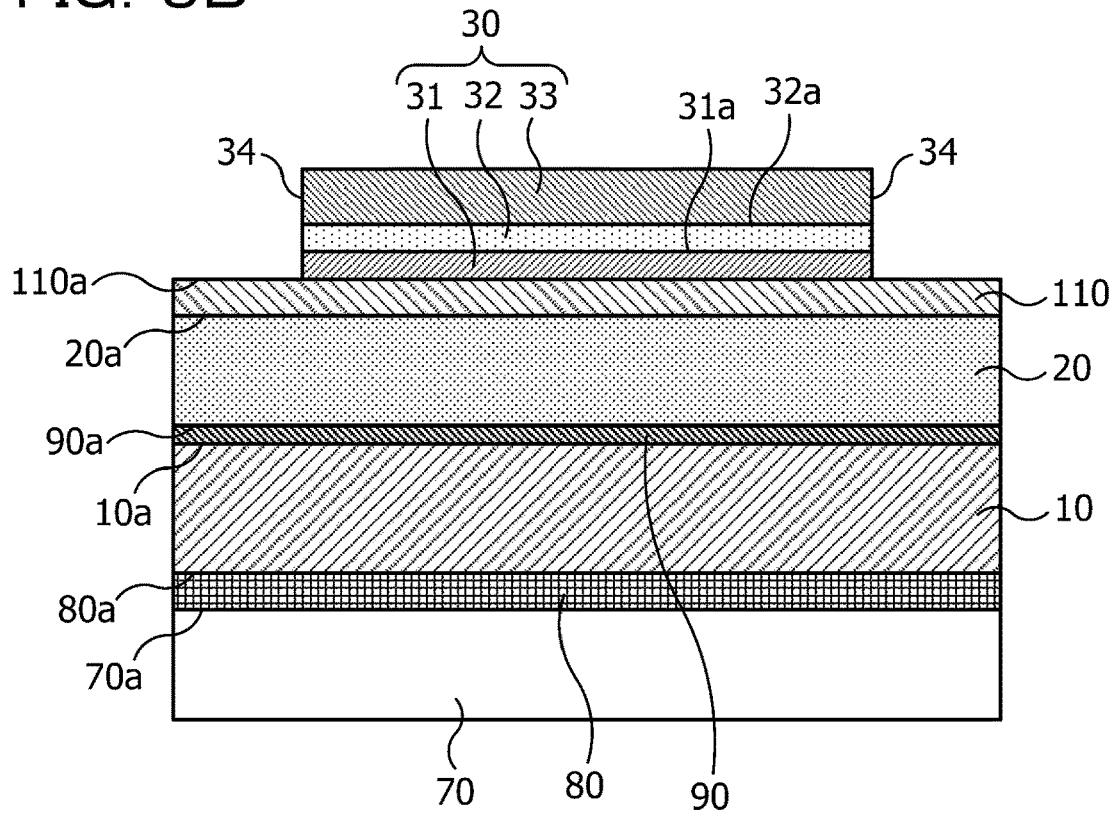

After the formation of the stack structure and the inter-element isolation region as described above, as illustrated in FIG. 8B, the insulating layer in regions in which the source electrode 50 and the drain electrode 60 are to be formed is removed by etching to form opening portions 34 leading to the cap layer 110. For example, first, a mask (not illustrated) having an opening portion in the regions in which the source electrode 50 and the drain electrode 60 are to be formed is formed by using the photolithography technology. Dry etching using a fluorine-based gas or a chlorine-based gas is performed on the insulating layer at the opening portion of the mask to remove the third insulating film 33, the second insulating film 32, and the first insulating film 31. Therefore, the insulating layer 30 having the opening portions 34 is formed, as illustrated in FIG. 8B. After the formation of the opening portion 34, the mask is removed.

Figure 9A:
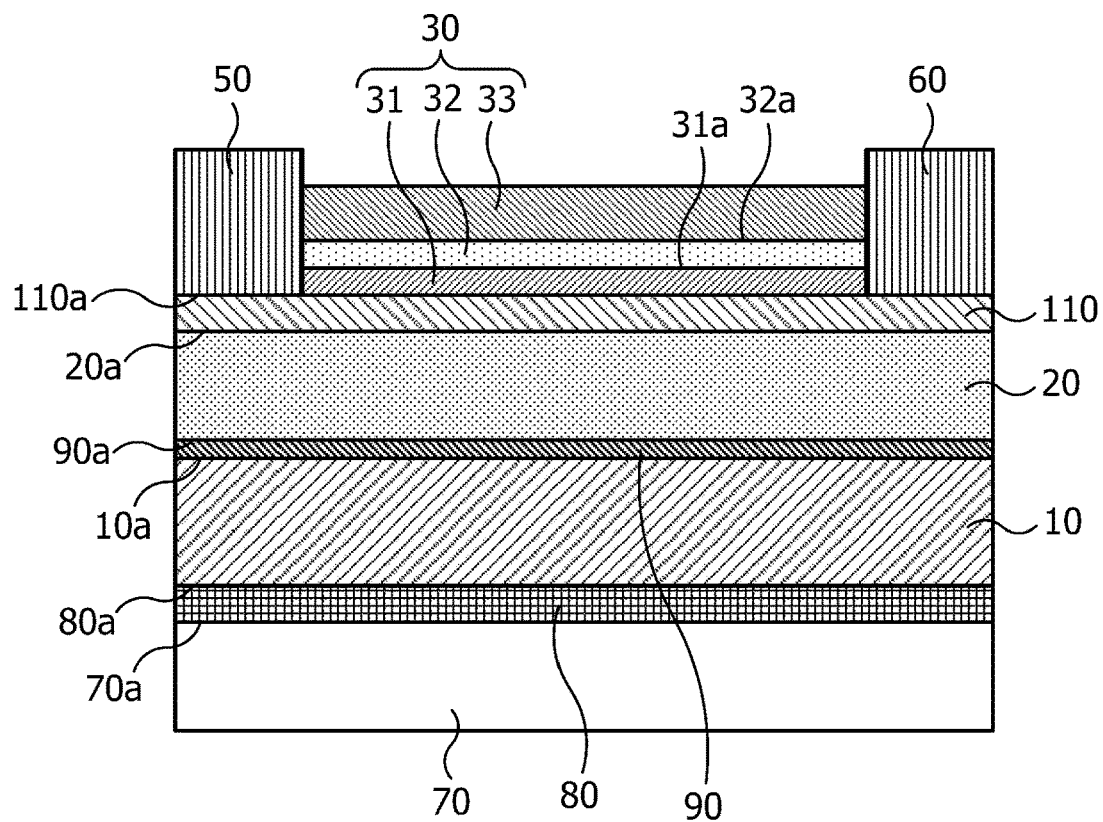
FIGS. 9A and 9B are diagrams (part 3) describing the example of the method for manufacturing the semiconductor device according to the third embodiment.

After the formation of the opening portion 34 of the insulating layer as illustrated in FIG. 9A, the source electrode 50 and the drain electrode 60 are formed at the opening portions 34 of the insulating layer 30. In this case, first, an electrode metal is formed in the regions where the source electrode 50 and the drain electrode 60 are to be formed, by using the photolithography technology, the vapor deposition technology, and the lift-off technology. For example, a stack of Ta having a thickness of 20 nm and Al having a thickness of 200 nm is formed as the electrode metal. After the formation of the electrode metal, heat treatment is performed under a temperature condition in a range of 400° C. to 1000° C., for example, at a temperature of 550° C. in a nitrogen atmosphere to build an ohmic contact of the electrode metal. Therefore, the source electrode 50 and the drain electrode 60 are formed over the cap layer 110 at the opening portions 34 of the insulating layer 30.

Figure 9B:
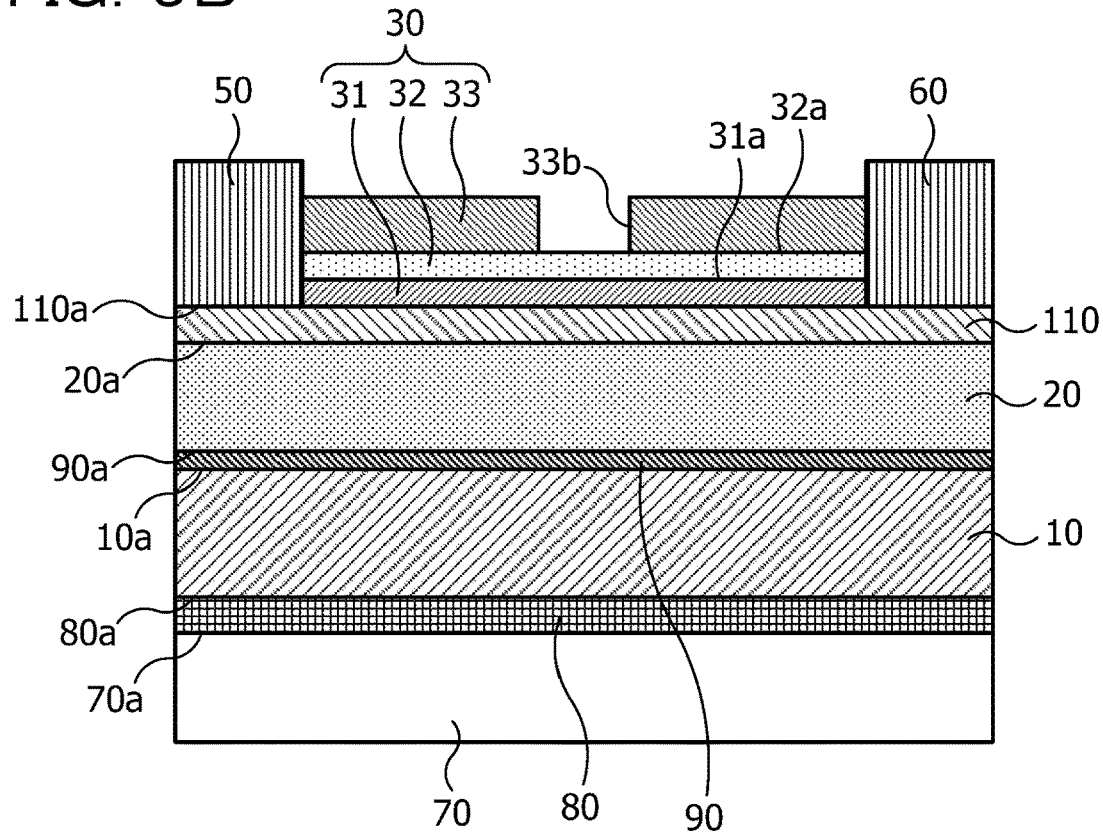

After the formation of the source electrode 50 and the drain electrode 60, as illustrated in FIG. 9B, the opening portion 33*b* is formed at the third insulating film 33 of the insulating layer 30. The opening portion 33*b* is provided in a region in which the gate electrode 40 is to be formed. At a time of the formation of the opening portion 33*b*, first, a mask (not illustrated) having an opening portion in a region where the gate electrode 40 is to be formed is formed by using the photolithography technology, and dry etching using a fluorine-based gas is performed. By this etching, the third insulating film 33 of SiN exposed from the opening portion of the mask is removed, and the opening portion 33*b* of the third insulating film 33 is formed. SiAlN used for the second insulating film 32 has higher an etching resistance to the fluorine-based gas than SiN used for the third insulating film 33. Accordingly, in the etching of the third insulating film 33 of SiN using the fluorine-based gas, the second insulating film 32 of SiAlN below the third insulating film 33 functions as an etching stopper. For this reason, the opening portion 33*b* is formed by etching with high depth-accuracy. After the formation of the opening portion 33b by etching the third insulating film 33, the mask is removed.

After the formation of the opening portion 33b of the third insulating film 33 in the insulating layer 30, as illustrated in FIG. 6 described above, the gate electrode 40 is formed at the position of the opening portion 33b. At this time, an electrode metal is formed at the position of the opening portion 33b of the third insulating film 33 by using the photolithography technology, the vapor deposition technology, and the lift-off technology. For example, a stack of Ni having a thickness of 30 nm and Au having a thickness of 400 nm is formed as the electrode metal. The electrode metal is formed over the upper surface of the third insulating film 33, and is also formed to enter the opening portion 33b. Therefore, the gate electrode 40 having a MIS type gate structure is formed.

By the steps in this manner, the semiconductor device 1B as illustrated in FIG. 6 described above is manufactured.

In the semiconductor device 1B, the insulating layer 30 having a three-layer structure including the first insulating film 31 using SiN, the second insulating film 32 using SiAlN, and the third insulating film 33 using SiN is provided between the barrier layer 20 and the gate electrode 40. The second insulating film 32 functions as an etching stopper when the opening portion 33b is formed at the third insulating film 33 by etching. In the semiconductor device 1B, the cap layer 110 that covers the barrier layer 20 is provided under the insulating layer 30. With the insulating layer 30 and the cap layer 110, damage inflicted on the barrier layer 20 is suppressed, and deterioration in performance of the semiconductor device 1B, such as an increase in leakage current, is suppressed. For example, it is possible to suppress damage inflicted on the barrier layer 20 such as generation of a defect due to breakage of a relatively weak bond between In and N in the barrier layer 20 of InAlGaN or desorption of In. With the second insulating film 32 and the first insulating film 31 remaining after the etching, a distance between the gate electrode 40 formed at the opening portion 33b and the channel layer 10 is controlled, and the performance of the semiconductor device 1B is stabilized. By adopting the insulating layer 30 having the three-layer structure as described above, the high-performance semiconductor device 1B including the barrier layer 20 in which damage is suppressed is stably realized.

In the semiconductor device 1B, the types of metals and the layer structures of the gate electrode 40, the source electrode 50, and the drain electrode 60 are not limited to the examples described above, and the methods for forming the gate electrode 40, the source electrode 50, and the drain electrode 60 are not limited to the examples described above. Each of the gate electrode 40, the source electrode 50, and the drain electrode 60 may have a single-layer structure or a stack structure. At the time of the formation of the source electrode 50 and the drain electrode 60, the heat treatment as described above does not have to be performed as long as the ohmic contact is realized by the formation of the electrode metals for these electrodes. At the time of the formation of the gate electrode 40, heat treatment may be further performed after the formation of the electrode metal for the gate electrode 40.

As described above, the first to third embodiments are described.

The semiconductor device 1, 1A, 1B, and the like having the configurations described in the first to third embodiments described above may be applied to various electronic devices. As an example, description is given below of the cases where the semiconductor devices having the configurations as described above are applied to a semiconductor package, a power factor correction circuit, a power supply device, and an amplifier.

Fourth Embodiment

An example of applying the semiconductor device having the configuration as described above to a semiconductor package is described here, as a fourth embodiment.

Figure 10:
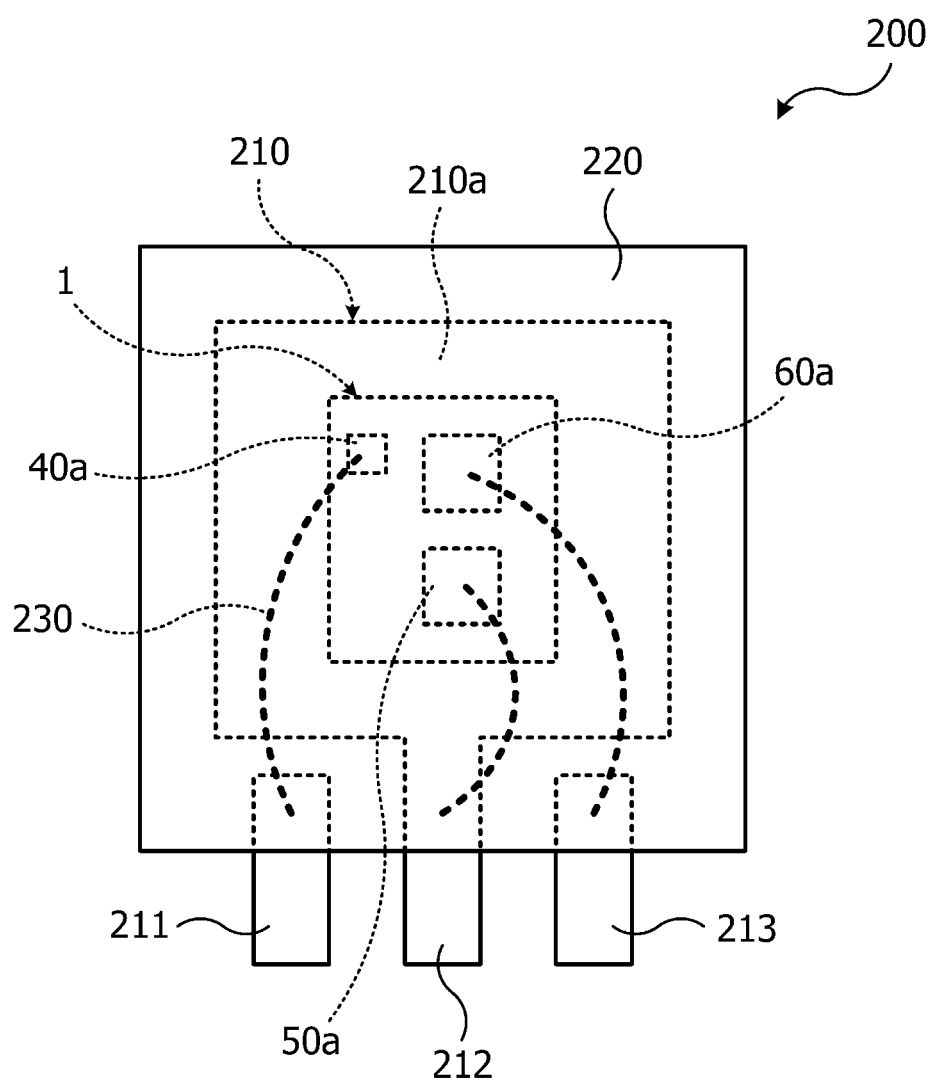
FIG. 10 is a diagram describing an example of a semiconductor package according to a fourth embodiment.

FIG. 10 is a diagram describing an example of a semiconductor package according to the fourth embodiment. FIG. 10 schematically illustrates a main portion plan view of the example of the semiconductor package.

A semiconductor package 200 illustrated in FIG. 10 is an example of a discrete package. For example, the semiconductor package 200 includes the semiconductor device 1 (FIG. 1) described in the first embodiment described above, a lead frame 210 over which the semiconductor device 1 is mounted, and a resin 220 that seals the semiconductor device 1 and the lead frame 210.

For example, the semiconductor device 1 is mounted over a die pad 210a of the lead frame 210 by using a die-attach material or the like (not illustrated). A pad 40a coupled to the gate electrode 40 described above, a pad coupled to the source electrode 50, and a pad 60a coupled to the drain electrode 60 are provided in the semiconductor device 1. The pad 40a, the pad and the pad 60a are coupled to a gate lead 211, a source lead 212, and a drain lead 213 of the lead frame 210, respectively, by using wires 230 made of Au, Al, and the like. The lead frame 210, the semiconductor device 1 mounted over the lead frame 210, and the wires 230 coupling the lead frame 210 and the semiconductor device 1 to each other are sealed in the resin 220 such that each of the gate lead 211, the source lead 212, and the drain lead 213 is partially exposed.

An external coupling electrode coupled to the source electrode 50 may be provided over a surface of the semiconductor device 1 on the opposite side to a surface at which the pad 40a coupled to the gate electrode 40 and the pad 60a coupled to the drain electrode 60 are provided. A conductive joining material such as solder may be used to couple the external coupling electrode to the die pad 210a leading to the source lead 212.

For example, the semiconductor device 1 described in the first embodiment described above is used, and the semiconductor package 200 having such a configuration is obtained.

As described above, in the semiconductor device 1, the insulating layer 30 having a three-layer structure is provided over the barrier layer 20 using a nitride semiconductor containing In, Al, and Ga. The insulating layer 30 includes the first insulating film 31 using SiN, the second insulating film 32 using SiAlN, and the third insulating film 33 using SiN. The gate electrode 40 is provided at the opening portion 33b formed at the third insulating film 33 by etching. Since the second insulating film 32 functions as an etching stopper when the opening portion 33b is formed by etching, damage to the barrier layer due to etching, an increase in leakage current due to the damage, and the like are suppressed. Therefore, the high-performance semiconductor device 1 including the barrier layer 20 in which damage is suppressed is realized. The high-performance semiconductor package 200 is realized by using such a semiconductor device 1.

Although the semiconductor device 1 is described here as an example, a semiconductor package may be obtained in the same manner by using the other semiconductor devices 1A, 1B, and the like.

Fifth Embodiment

An example of applying the semiconductor device having the configuration as described above to a power factor correction circuit is described here, as a fifth embodiment.

Figure 11:
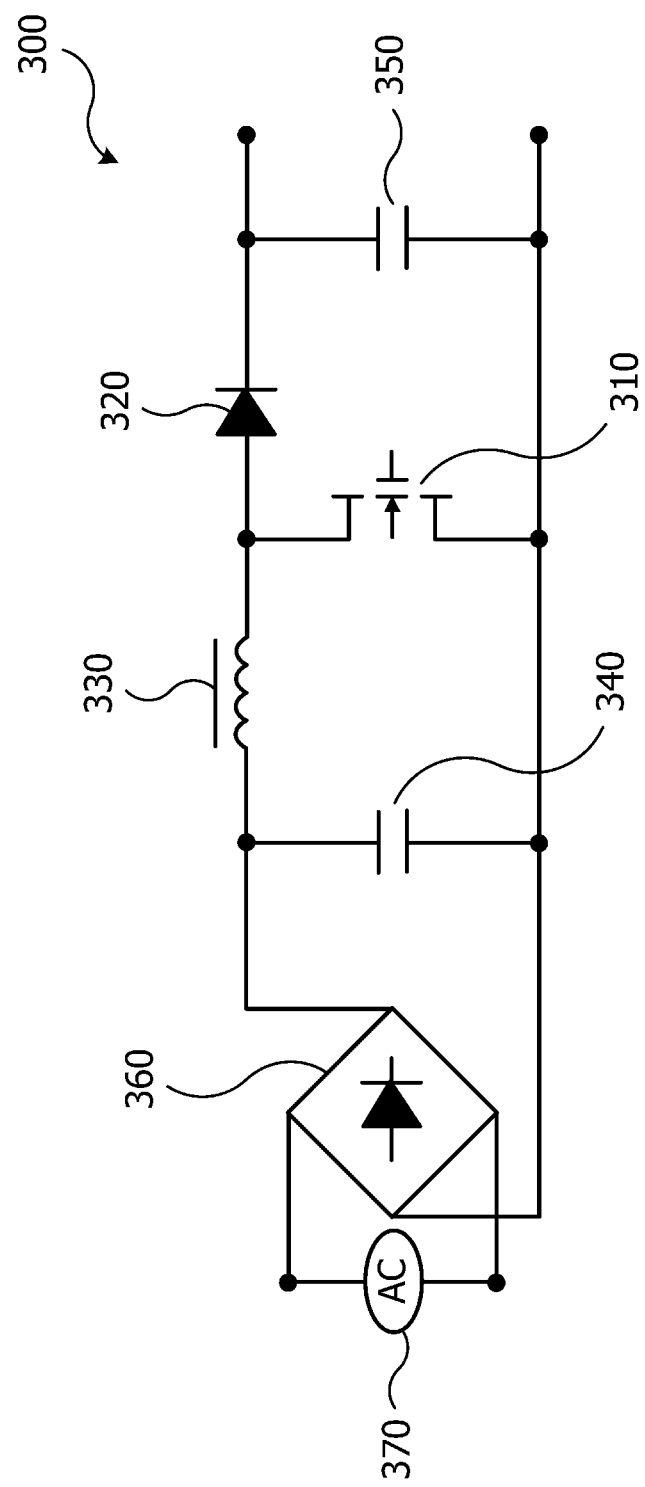
FIG. 11 is a diagram describing an example of a power factor correction circuit according to a fifth embodiment.

FIG. 11 is a diagram describing an example of a power factor correction circuit according to the fifth embodiment. FIG. 11 illustrates an equivalent circuit diagram of the example of the power factor correction circuit.

A power factor correction (PFC) circuit 300 illustrated in FIG. 11 includes a switch element 310, a diode 320, a choke coil 330, a capacitor 340, a capacitor 350, a diode bridge 360, and an alternating current (AC) power supply 370.

In the PFC circuit 300, a drain electrode of the switch element 310 is coupled to an anode terminal of the diode 320 and one terminal of the choke coil 330. A source electrode of the switch element 310 is coupled to one terminal of the capacitor 340 and one terminal of the capacitor 350. Another terminal of the capacitor 340 is coupled to another terminal of the choke coil 330. Another terminal of the capacitor 350 is coupled to a cathode terminal of the diode 320. A gate driver is coupled to a gate electrode of the switch element 310. The alternating current power supply 370 is coupled between both terminals of the capacitor 340 via the diode bridge 360, and a direct current (DC) power supply is extracted from between both terminals of the capacitor 350.

For example, the semiconductor devices 1, 1A, 1B, and the like described above are used for the switch element 310 of the PFC circuit 300 having such a configuration.

As described above, the semiconductor devices 1, 1A, 1B, and the like, the insulating layer 30 having a three-layer structure is provided over the barrier layer 20 using a nitride semiconductor containing In, Al, and Ga. The insulating layer 30 includes the first insulating film 31 using SiN, the second insulating film 32 using SiAlN, and the third insulating film 33 using SiN. The gate electrode 40 is provided at the opening portion 33b formed at the third insulating film 33 by etching. Since the second insulating film 32 functions as an etching stopper when the opening portion 33b is formed by etching, damage to the barrier layer 20 due to etching, an increase in leakage current due to the damage, and the like are suppressed. Therefore, the high-performance semiconductor devices 1, 1A, 1B, and the like including the barrier layer 20 in which damage is suppressed are realized. The high-performance PFC circuit 300 is realized by using such semiconductor devices 1, 1A, 1B, and the like.

Sixth Embodiment

An example of applying the semiconductor device having the configuration as described above to a power supply device is described here, as a sixth embodiment.

Figure 12:
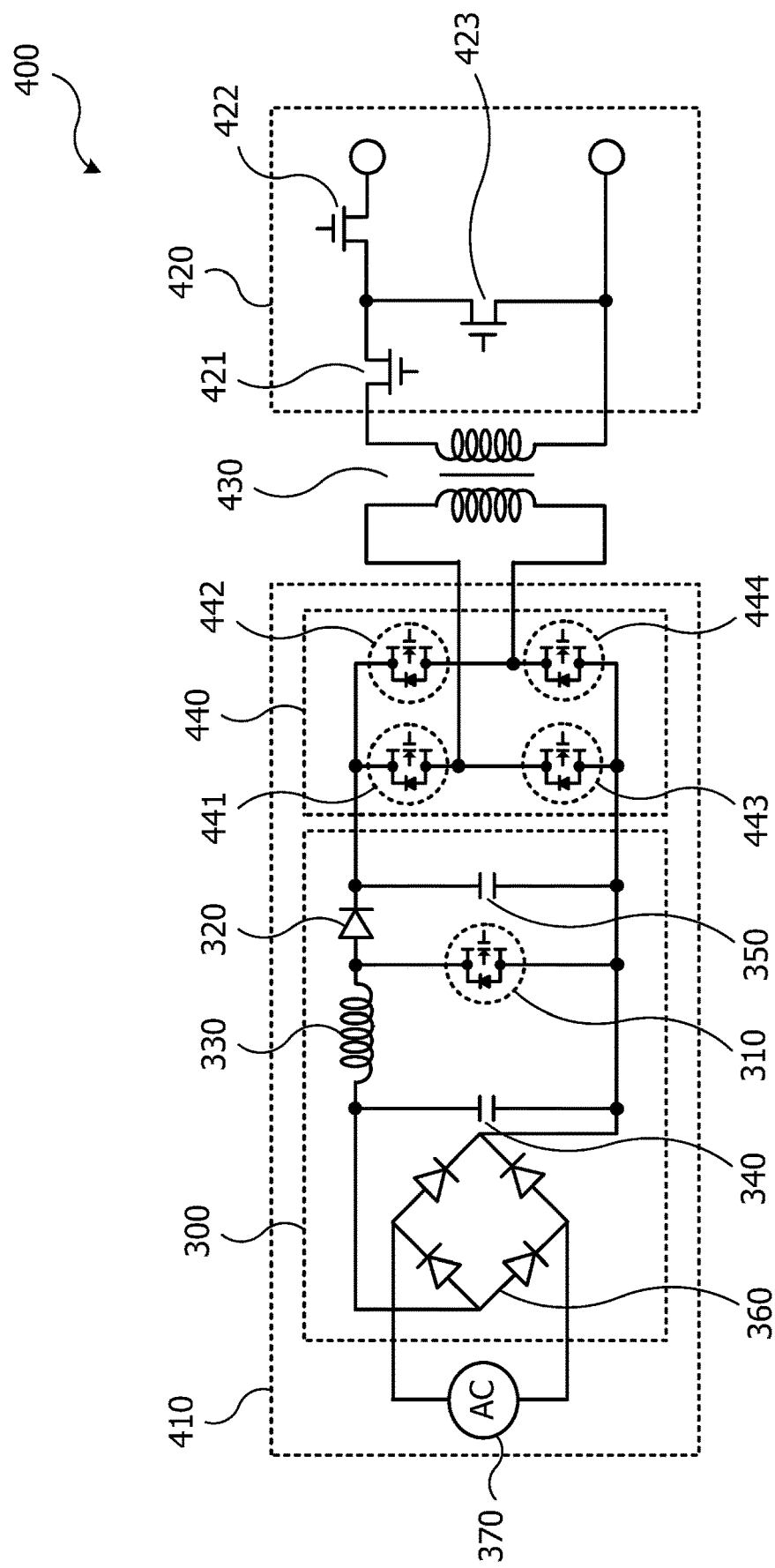
FIG. 12 is a diagram describing an example of a power supply device according to a sixth embodiment.

FIG. 12 is a diagram describing an example of a power supply device according to the sixth embodiment. FIG. 12 illustrates an equivalent circuit diagram of the example of the power supply device.

A power supply device 400 illustrated in FIG. 12 includes a primary-side circuit 410, a secondary-side circuit 420, and a transformer 430 provided between the primary-side circuit 410 and the secondary-side circuit 420.

The primary-side circuit 410 includes the PFC circuit 300 as described in the fifth embodiment described above and an inverter circuit, for example, a full-bridge inverter circuit 440 coupled between both terminals of the capacitor 350 of the PFC circuit 300. The full-bridge inverter circuit 440 includes a plurality of (for example, four in this case) switch elements of a switch element 441, a switch element 442, a switch element 443, and a switch element 444.

The secondary-side circuit 420 includes a plurality of (for example, three in this case) switch elements of a switch element 421, a switch element 422, and a switch element 423.

For example, the semiconductor devices 1, 1A, 1B, and the like described above are used for the switch element 310 of the PFC circuit 300 included in the primary-side circuit 410 and the switch elements 441 to 444 of the full-bridge inverter circuit 440 in the power supply device 400 having such a configuration. For example, a normal MIS type field-effect transistor using Si is used for the switch elements 421 to 423 of the secondary-side circuit 420 in the power supply device 400.

As described above, the semiconductor devices 1, 1A, 1B, and the like, the insulating layer 30 having a three-layer structure is provided over the barrier layer 20 using a nitride semiconductor containing In, Al, and Ga. The insulating layer 30 includes the first insulating film 31 using SiN, the second insulating film 32 using SiAlN, and the third insulating film 33 using SiN. The gate electrode 40 is provided at the opening portion 33b formed at the third insulating film 33 by etching. Since the second insulating film 32 functions as an etching stopper when the opening portion 33b is formed by etching, damage to the barrier layer 20 due to etching, an increase in leakage current due to the damage, and the like are suppressed. Therefore, the high-performance semiconductor devices 1, 1A, 1B, and the like including the barrier layer 20 in which damage is suppressed are realized. The high-performance power supply device 400 is realized by using such semiconductor devices 1, 1A, 1B, and the like.

Seventh Embodiment

An example of applying the semiconductor device having the configuration as described above to an amplifier is described here, as a seventh embodiment.

Figure 13:
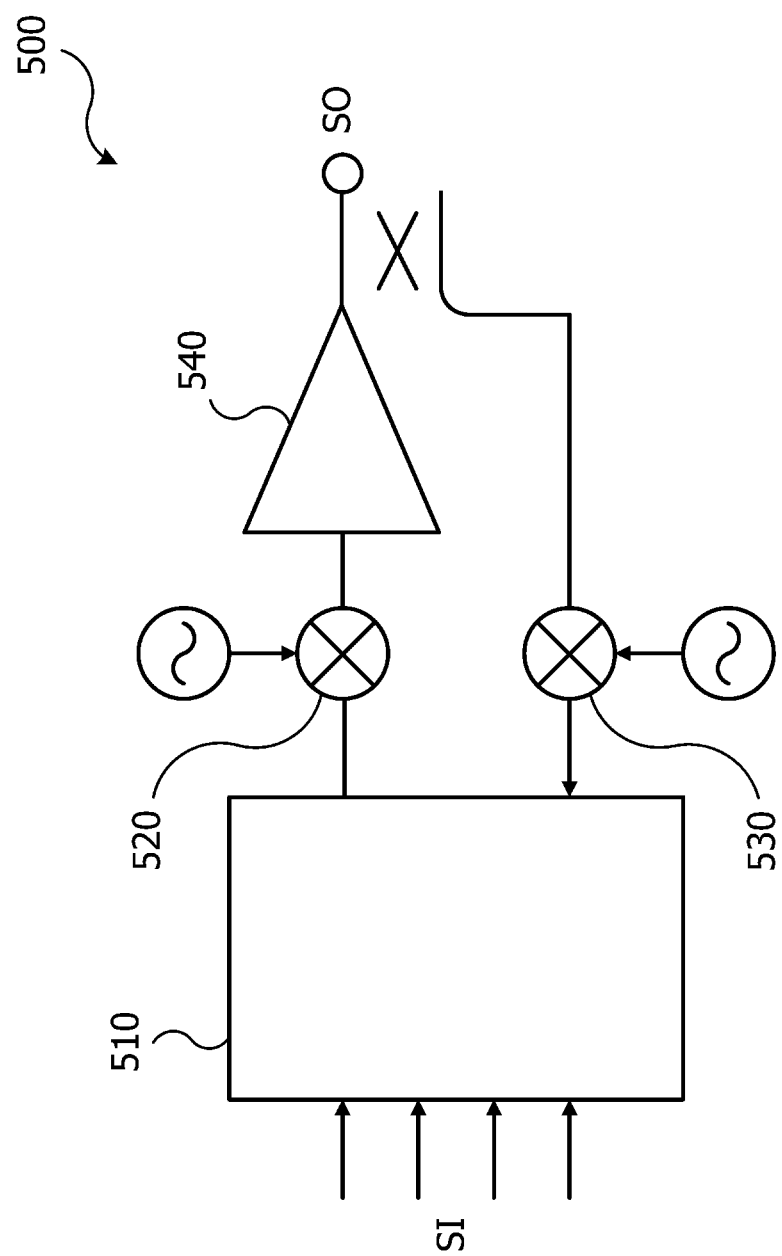
FIG. 13 is a diagram describing an example of an amplifier according to a seventh embodiment.

FIG. 13 is a diagram describing an example of an amplifier according to the seventh embodiment. FIG. 13 illustrates an equivalent circuit diagram of the example of the amplifier.

An amplifier 500 illustrated in FIG. 13 includes a digital predistortion circuit 510, a mixer 520, a mixer 530, and a power amplifier 540.

The digital predistortion circuit 510 compensates for non-linear distortion of an input signal. The mixer 520 mixes an alternating current signal and an input signal SI subjected to the non-linear distortion compensation. The power amplifier 540 amplifies a signal obtained by mixing the alternating current signal and the input signal SI. For example, in the amplifier 500, switching of a switch may cause an output signal SO to be mixed with an alternating current signal in the mixer 530 and to be transmitted to the digital predistortion circuit 510. The amplifier 500 may be used as a high-frequency amplifier or a high-output amplifier.

As the power amplifier 540 of the amplifier 500 having such a configuration, the semiconductor devices 1, 1A, 1B, and the like described above are used.

As described above, the semiconductor devices 1, 1A, 1B, and the like, the insulating layer 30 having a three-layer structure is provided over the barrier layer 20 using a nitride semiconductor containing In, Al, and Ga. The insulating layer 30 includes the first insulating film 31 using SiN, the second insulating film 32 using SiAlN, and the third insulating film 33 using SiN. The gate electrode 40 is provided at the opening portion 33b formed at the third insulating film 33 by etching. Since the second insulating film 32 functions as an etching stopper when the opening portion 33b is formed by etching, damage to the barrier layer 20 due to etching, an increase in leakage current due to the damage, and the like are suppressed. Therefore, the high-performance semiconductor devices 1, 1A, 1B, and the like including the barrier layer 20 in which damage is suppressed are realized. The high-performance amplifier 500 is realized by using such semiconductor devices 1, 1A, 1B, and the like.

Various electronic devices (the semiconductor package 200, the PFC circuit 300, the power supply device 400, the amplifier 500, and the like described in the fourth to seventh embodiments described above) to which the semiconductor devices 1, 1A, 1B, and the like described above are applied may be mounted in various electronic apparatuses (may also be referred to as "electronic devices"). For example, the electronic devices may be mounted in various electronic apparatuses such as a computer (a personal computer, a super computer, a server, or the like), a smartphone, a mobile phone, a tablet terminal, a sensor, a camera, an audio device, a measurement device, an inspection device, a manufacturing device, a transmitter, a receiver, and a radar device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a channel layer that includes a first nitride semiconductor that contains Ga;
    a barrier layer that is provided on a first surface side of the channel layer, and includes a second nitride semiconductor that contains In, Al, and Ga;
    a source electrode and a drain electrode that are provided on a second surface side of the barrier layer opposite to the channel layer side;
    a gate electrode that is provided between the source electrode and the drain electrode, on the second surface side of the barrier layer; and
    an insulating layer that is provided between the second surface of the barrier layer and the gate electrode,
    wherein the insulating layer includes
    a first insulating film that is provided on the second surface side of the barrier layer and contains SiN,
    a second insulating film that is provided on a third surface side of the first insulating film opposite to the barrier layer side and contains SiAlN, and
    a third insulating film that is provided on a fourth surface side of the second insulating film opposite to the first insulating film side, has an opening portion that leads to the fourth surface, and contains SiN, and
    the gate electrode is provided at the opening portion of the third insulating film.

2. The semiconductor device according to claim 1, wherein a bottom surface of the gate electrode on the barrier layer side is in contact with the fourth surface of the second insulating film.

3. The semiconductor device according to claim 1, further comprising:
    a spacer layer that includes a third nitride semiconductor that contains Al between the channel layer and the barrier layer.

4. The semiconductor device according to claim 1, further comprising:
    a cap layer that is provided on the second surface side of the barrier layer and includes a fourth nitride semiconductor that contains Ga,
    wherein the insulating layer is provided on a fifth surface side of the cap layer opposite to the barrier layer side.

5. A method for manufacturing a semiconductor device, comprising:
    forming a barrier layer that includes a second nitride semiconductor that contains In, Al, and Ga on a first surface side of a channel layer that includes a first nitride semiconductor that contains Ga;
    forming a source electrode and a drain electrode on a second surface side of the barrier layer opposite to the channel layer side;
    forming a gate electrode between the source electrode and the drain electrode, on the second surface side of the barrier layer; and
    forming an insulating layer between the second surface of the barrier layer and the gate electrode,
    wherein the forming of the insulating layer includes
    forming a first insulating film that contains SiN on the second surface side of the barrier layer,
    forming a second insulating film that contains SiAlN on a third surface side of the first insulating film opposite to the barrier layer side, and
    forming a third insulating film that contains SiN and has an opening portion that leads to the fourth surface, on a fourth surface side of the second insulating film opposite to the first insulating film side, and
    in the forming of the gate electrode, the gate electrode is formed at the opening portion of the third insulating film.

6. The method for manufacturing the semiconductor device according to claim 5,
    wherein in the forming of the third insulating film, the opening portion is formed by using the second insulating film as an etching stopper and etching a part of the third insulating film, by using a fluorine-based gas.

7. The method for manufacturing the semiconductor device according to claim 5,
    wherein in the forming of the insulating layer, the first insulating film, the second insulating film, and the third insulating film are continuously formed in a film formation device.

8. The method for manufacturing the semiconductor device according to claim 5,
    wherein the forming of the channel layer, the forming of the barrier layer, and the forming of the insulating layer are continuously performed in a film formation device.

9. An electronic device comprising:
    a channel layer that includes a first nitride semiconductor that contains Ga;
    a barrier layer that is provided on a first surface side of the channel layer, and includes a second nitride semiconductor that contains In, Al, and Ga;
    a source electrode and a drain electrode that are provided on a second surface side of the barrier layer opposite to the channel layer side;
    a gate electrode that is provided between the source electrode and the drain electrode, on the second surface side of the barrier layer; and an insulating layer that is provided between the second surface of the barrier layer and the gate electrode, wherein the insulating layer includes a first insulating film that is provided on the second surface side of the barrier layer and contains SiN, a second insulating film that is provided on a third surface side of the first insulating film opposite to the barrier layer side and contains SiAlN, and a third insulating film that is provided on a fourth surface side of the second insulating film opposite to the first insulating film side, has an opening portion that leads to the fourth surface, and contains SiN, and the gate electrode is provided at the opening portion of the third insulating film.

* * * * *